United States Patent

Inomata et al.

Patent Number: 6,114,056
Date of Patent: Sep. 5, 2000

[54] MAGNETIC ELEMENT, AND MAGNETIC HEAD AND MAGNETIC MEMORY DEVICE USING THEREOF

[75] Inventors: Koichiro Inomata, Yokohama; Yoshiaki Saito, Kawasaki; Katsutaro Ichihara; Keiichiro Yusu, both of Yokohama; Hideo Ogiwara, Chigasaki, all of Japan

[73] Assignee: Kabushiki Kaisha Toshiba, Kawasaki, Japan

[21] Appl. No.: 09/074,588

[22] Filed: May 8, 1998

[30] Foreign Application Priority Data

May 9, 1997 [JP] Japan .................................. 9-118991
Feb. 20, 1998 [JP] Japan .................................. 10-039342

[51] Int. Cl.[7] .................................................. G11B 5/66
[52] U.S. Cl. ..................... 428/692; 428/560; 428/694 R; 428/694 T; 428/694 TM; 428/694 TS; 428/900; 360/113
[58] Field of Search ................................ 428/692, 694 R, 428/694 T, 694 TM, 694 TS, 560, 900; 360/113

[56] References Cited

U.S. PATENT DOCUMENTS

5,652,054  7/1997  Kikitsu .

FOREIGN PATENT DOCUMENTS

0 308 334   3/1989   European Pat. Off. .
0 577469   1/1994   European Pat. Off. .
WO95/35507  12/1995  WIPO .

OTHER PUBLICATIONS

F. Schelp et al., "Spin–dependent Tunneling between Ferromagnetic Metals in a New Type of Tunnel Junction (Abstract)", (Magnetoresistance in Tunneling and Intermetallics, Bill Gallagher, Chairman), J. Appl. Phys. 81 (8), p. 5508, (Apr. 15, 1997).

"Giant Magnetoresistance of (001)Fe/(001)Cr Magnetic Superlattices," M.N. Baibich et al., Physical Review Letters, vol. 61, No. 21, Nov. 21, 1998, pp. 2472–2475.

"Oscillatory Interlayer Coupling and Giant Magnetoresistance in Co/Cu Multilayers," D.H. Mosca et al., Jnl. of Magnetism and Magnetic Materials, 94 (1991), pp. L1–L5.

"Oscillatory Magnetic Exchange Coupling through Thin Copper Layers," S.S.P. Parkin et al., Physical Review Letters, vol. 66, No. 16, Apr. 22, 1991, pp. 2152–2155.

"Perpendicular Giant Magnetoresistances of Ag/Co Multilayers," W.P. Pratt et al., Physical Revew Letters, vol. 66, No. 23, Jun. 10, 1991, pp. 3060–3063.

"Giant Magnetoresistance in Heterogeneous Cu–Co Alloys," A.E. Berkowitz et al., Physical Review Letters, vol. 68, No. 25, Jun. 22, 1992, pp. 3745–3748.

"Large Magnetoresistance at Room Temperature in Ferromagnetic Thin Film Tunnel Junctions," J.S. Moodera et al., Physical Review Letters, vol. 74, No. 16, Apr. 17, 1995, pp. 3273–3276.

(List continued on next page.)

Primary Examiner—Leszek Kiliman
Attorney, Agent, or Firm—Finnegan, Henderson, Farabow, Garrett & Dunner, L.L.P.

[57] ABSTRACT

A magnetic element comprises a granular magnetic film which has ferromagnetic fine particles dispersed in a dielectric matrix and does not display superparamagnetism and further possesses a finite coercive force, and a ferromagnetic film. A granular magnetic film and a ferromagnetic film are stacked or arrayed along one surface of a substrate and constitutes a ferromagnetic tunnel junction film. In the ferromagnetic tunnel junction film, the granular magnetic film functions as a barrier. Of the granular magnetic film and the ferromagnetic film, by varying spin direction of one ferromagnetic film through an external magnetic field, a giant magnetoresistance effect is manifested. Such a magnetic element is characterized in that magnetoresistance change rate is large, saturation magnetic field is small, resistance of the element can be controlled to an appropriate value, performance is small in its variation and stable.

21 Claims, 20 Drawing Sheets

OTHER PUBLICATIONS

Daughton, "Magnetic tunneling applied to memory (invited)," J. Appl. Phys., 81:3758–63 (Apr. 1997).

Schelp et al., "Spin–dependent tunneling between ferromagnetic metals in a new type of tunnel junction (abstract)," J. Appl. Phys., 81:5508 (Apr. 1997).

Plaskett et al., "Magnetoresistance and magnetic properties of NiFe/oxide/Co junctions prepared by magnetron sputtering," J. Appl. Phys., 76:6104–06 (Nov. 1994).

Copy of Communication from the European Patent Office dated Aug. 7, 1998.

Copy of Communication from the European Patent Office dated Nov. 6, 1998.

MAGNETIC ELEMENT, AND MAGNETIC HEAD AND MAGNETIC MEMORY DEVICE USING THEREOF

BACKGROUND OF THE INVENTION

1. Field of the Invention

The present invention relates to a magnetic element making use of a tunnel current, and a magnetic head and a magnetic memory device both of which using thereof.

2. Description of the Related Art

Magnetoresistance effect is a phenomenon that the electric resistance of a certain kind of magnetic material varies through application of magnetic field. A magnetoresistance effect element (MR element) taking advantage of magnetoresistance effect is in use in a magnetic head, a magnetic sensor and the like. Further, a magnetoresistance effect memory or the like using a magnetoresistance effect element is proposed. In such an MR element, high sensitivity to an external magnetic field, quicker response and the like are required.

An MR element using a ferromagnetic material is excellent in its thermal stability and an applicable temperature range thereof is large. For an MR element using a ferromagnetic material, a thin film of a ferromagnetic alloy such as a NiFe alloy has been used. Through application of such an MR element for a read head of a hard disc and so on, high density magnetic recording is attained. However, an MR element using a thin film of a NiFe alloy has, since magnetoresistance change rate(MR change rate)is such small as about 2 to 3%, a problem that, when tried to attain further higher density recording, sufficient sensitivity can not be obtained.

Besides, recently, as a new material displaying magnetoresistance effect, an artificial lattice film stacked alternately a ferromagnetic layer and a non-magnetic metal layer with a period of a few nanometers is attracting attention as a material displaying a giant magnetoresistance effect. For instance, a magnetoresistance effect material in which magnetic moments of ferromagnetic layers disposed oppositely through a non-magnetic layer such as an artificial lattice film of Fe/Cr(Phys. Rev. Lett. 61, 2472(1988)) or an artificial lattice film of Co/Cu(J. Mag. Mag. Mater. 94, L1(1991), Phys. Rev. Lett. 66, 2152(1991)) are magnetically coupled in an anti-parallel state is found.

The above described artificial lattice films display a magnetoresistance effect change rate of several tens % remarkably larger than that of a conventional permalloy alloy thin film. Such a giant magnetoresistance effect (GMR) is caused through electron scattering dependent on a direction of the spin of a ferromagnetic layer. However, an artificial lattice film has a problem that numbers of stacked layer has to be increased to obtain an enough large magnetoresistance effect or a problem that, since saturation magnetic field (magnetic field where the resistance value saturates) is such large as several teslas (T) or more, application to a magnetic head and the like by itself is not suitable.

There, with an objective to reduce a saturation magnetic field, a spin valve film having a laminate film of a sandwich structure of ferromagnetic layer/non-magnetic layer/ferromagnetic layer has been developed. In a spin valve film, exchange bias is affected to one ferromagnetic layer to pin its magnetization, the other ferromagnetic layer is reversed in its magnetization through external magnetic field. Thus, the relative angle of magnetization directions of 2 ferromagnetic layers is varied to obtain magnetoresistance effect. However, a spin valve film is not sufficient in its MR change rate and resistance itself of a laminate film is such small as several tens $\mu\Omega$cm. Therefore, there is a problem that relatively large electric current is required to detect an external magnetic field.

In addition, a very large magnetoresistance effect is known to be obtained when utilizing a so-called perpendicular magnetoresistance effect in which an electric current is flowed to a magnetic multi-layer film in a direction perpendicular to a film plane (Phys. Rev. Lett. 66, 3060 (1991)). However, in this case, there is a problem that, since the path of electric current is short and resistance is small due to each layer being metal, without finely processing down to sub-micron or less, magnetoresistance effect at room temperature can not be measured.

Different from the above described multi-layer structures, a so-called granular magnetic film dispersed magnetic ultra-fine particles in a non-magnetic metal matrix is also known to show a giant magnetoresistance effect based on spin-dependent conduction (Phys. Rev. Lett. 68, 3745(1992)). A granular magnetic film is high in its resistance when magnetic field is not applied because the spin of each magnetic ultra-fine particle is randomly aligned each other, and the resistance decreases when each spin is aligned to a direction of magnetic field through application of magnetic field. As a result, a magnetoresistance effect based on spin-dependent scattering appears. Since manufacturing of granular magnetic film is easy compared with such as an artificial lattice film, it is expected as a magnetoresistance effect element of next generation. However, since, in a conventional granular magnetic film, magnetic ultra-fine particles display superparamagnetism, there is a problem that saturation magnetic field is intrinsically very large.

A giant magnetoresistance effect different in mechanism from the above described spin-dependent scattering and based on ferromagnetic tunnel effect is also found. This is to generate a tunnel current through application of electric voltage between both ferromagnetic layers in a structure which is composed of a laminate film of 3 layers of ferromagnetic layer/insulating layer/ferromagnetic layer and in which coercive force of one ferromagnetic layer is small than that of the other ferromagnetic layer. In this time, if only the spin of the ferromagnetic layer small in its coercive force is reversed, since a tunnel electric current is largely different depending on whether spins of 2 ferromagnetic layers are parallel or anti-parallel, a giant magnetoresistance effect can be obtained.

Such a ferromagnetic tunnel junction element has a feature that its structure is simple and, at room temperature, magnetoresistance change rate such large as about 20% can be obtained. However, in order to make the tunnel effect appear, such thin thickness of an insulating layer as less than several nanometers is required. Since stable and homogeneous manufacturing of such a thin insulating layer is difficult, the magnetoresistance change rate tends to vary largely. When the resistance of an insulating layer is too high, in case of using this for a memory element, such problems are expected that the quick response of the element can not be obtained and noise is increased to reduce S/N ratio. Further, if increased an electric current which is flowed to a ferromagnetic tunnel junction element to obtain a desired output voltage, the magnetoresistance change rate drastically decreases to result in a problem(Phys. Rev. Lett. 74, 3273(1995)).

As described above, a granular magnetic film dispersed magnetic ultra-fine particles in a matrix is easy in its manufacturing compared with an artificial lattice film and the magnetoresistance change rate thereof such large as about 10% can be obtained at room temperature. Further, since the ultra-fine particles are small in their particle diameters such as several tens angstroms or less enough to be mono magnetic domain, hysteresis of a magnetoresistance curve is small. Therefore, when used as an MR element, Barkhausen noise is expected to be small. However, because of superparamagnetism of conventional ultra-fine particles, saturation magnetization is intrinsically very large, resulting in a problem when being put into practical use.

Besides, a ferromagnetic tunnel junction element shows a magnetoresistance change rate such large as about 20% at room temperature and a small saturation magnetic field, but there is a problem that manufacturing of an element having stable properties is difficult due to a very thin film of an insulating layer. In addition, when an electric current which is flowed to a ferromagnetic tunnel junction element is increased to obtain a desired output voltage value, a problem appears that the MR change rate decreases drastically.

SUMMARY OF THE INVENTION

Therefore, an objective of the present invention is to provide a magnetic element of which magnetoresistance change rate is large, of which saturation magnetic field is small, of which element resistance can be controlled to an appropriate value, and which is capable of obtaining stable properties small in its variation. Further, it is to provide a magnetic element small in decrease of its magnetoresistance change rate if an electric current which is flowed to the element (or voltage)is increased to obtain a desired output voltage value(or electric current value). The other objective of the present invention is to provide a magnetic head and a magnetic memory device improved in their properties and their reliability through use of such a magnetic element.

A magnetic element of the present invention comprises a granular magnetic film which has a matrix of dielectric substance, ferromagnetic fine particles dispersed in the dielectric matrix, and coercive force, and a ferromagnetic film which is disposed close to the granular magnetic film and flows a tunnel electric current between it and the granular magnetic film.

A magnetic element of the present invention is to make magnetoresistance effect appear by changing the direction of the spin of, for instance, one magnetic film of smaller coercive force among a granular magnetic film and a ferromagnetic film. In a magnetic element of the present invention, a ferromagnetic film can be constituted by a ferromagnetic material divided into sections by a nonmagnetic material.

As specific disposition structures of a granular magnetic film and a ferromagnetic film, a structure stacked a granular magnetic film and a ferromagnetic film, a structure arrayed a granular magnetic film and a ferromagnetic film along a substrate surface and the like can be cited. Further, although a granular magnetic film and a ferromagnetic film should be basically disposed in contact, other than the granular magnetic film, an insulation film having a thickness which allows to flow a tunnel current between a granular magnetic film and a ferromagnetic film can be interposed.

The other magnetic element of the present invention comprises an insulating layer of which thickness allows a tunnel current to flow, and a first ferromagnetic film and a second ferromagnetic film disposed so as the insulating layer to be interposed therebetween, wherein, at least one of the first and the second ferromagnetic films is divided into sections by a non-magnetic material.

A magnetic head of the present invention comprises the above described magnetic element of the present invention and an electrode providing a sense current so as to flow a tunnel current to the magnetic element. A magnetic memory device of the present invention comprises the above described magnetic element of the present invention, a recording electrode providing an electric current magnetic field to the magnetic element, and a read electrode providing a sense current so as to flow a tunnel current to the magnetic element.

In the following, a principle of a magnetic element of the present invention displaying a giant magnetoresistance effect at lower magnetic field will be described.

FIG. 1A, FIG. 1B, FIG. 2A and FIG. 2B are conceptual diagrams of fundamental structures of a magnetic element of the present invention. In these figures, a ferromagnetic film F and a granular magnetic film G constitutes a ferromagnetic tunnel junction. Lines with arrow in the figures show magnetization directions. Here, a granular magnetic film G in the magnetic film of the present invention has ferromagnetic fine particles dispersed in a dielectric matrix. A granular magnetic film G is a ferromagnetic material having a coercive force of a finite value and does not display superparamagnetism.

Ideally, the spins of the ferromagnetic fine particles, as shown in FIG. 1A, FIG. 1B, FIG. 2A and FIG. 2B, are desirable to be aligned in one direction. The direction of the spin can be any one of states shown in FIG. 1A and FIG. 1B, FIG. 2A and FIG. 2B. Further, ferromagnetic fine particles are preferred to be arrayed in layer.

In such a structure, when a voltage is applied between a ferromagnetic film F and a granular magnetic film G through, for example, an electrode, conduction electrons of the ferromagnetic film F conduct between ferromagnetic fine particles in the granular magnetic film G due to tunnel effect to induce a tunnel current. Here, the directions of the spins are preserved. Here, let us consider applying an external magnetic field under such a circumstance.

In an initial state, as shown in FIG. 1A and FIG. 2A, spins of both magnetic films F and G are aligned in the identical directions. Here, while preserving the spins of the ferromagnetic film F and the granular magnetic film G, tunnel conduction occurs. Therefore, as shown in FIG. 3A, electrons of the spin band large in its state density(spin electrons shown by ↓ in FIG. 3A) contribute largely in conduction and electrons are tend to tunnel. That is, resistance is small.

Next, as shown in FIG. 1B and FIG. 2B, an external magnetic field small in its degree so as to reverse only the spin (spins of the ferromagnetic films F in FIG. 1B and FIG. 2B, same in the following)of a magnetic film of relatively small coercive force among both magnetic films F, G is provided. In this case, as shown in FIG. 3, since either spin band of respective magnetic film F, G experiences a spin band small in its state density, the electrons become difficult to tunnel compared with FIG. 3A. Therefore, resistance becomes large.

Thus, by reversing through an external magnetic field only the spin of a magnetic film of which coercive force is small, a giant magnetoresistance can be obtained. Here, if a soft magnetic material, for example, small in its coercive force is selected for a ferromagnetic film F, saturation magnetic field can be made small. Therefore, a magnetoresistance effect element employed a magnetic element of the present invention can be heightened in its sensitivity.

A granular magnetic film of the present invention, being non-superparamagnetic and ferromagnetic material, does not have a problem that saturation magnetic field is large like a conventional granular GMR material. A granular magnetic film of the present invention, because of dispersion of ferromagnetic fine particles in a dielectric matrix, is small in its electric resistance compared with a ferromagnetic tunnel junction having an insulating layer. Further, by controlling a length of electric current path direction (film thickness direction or in-plane direction) of a granular magnetic film, or by controlling volume packing rate, size, dispersion state and the like of ferromagnetic fine particles, the electric resistance can be controlled to an appropriate value. Therefore, according to its applications, a magnetic element of the present invention can be controlled in its electric resistance.

Further, in a ferromagnetic tunnel junction element, when an electric current(or voltage)flowing to the element is increased to obtain a desired output voltage value (or electric current value), through conduction of a spin wave of a long wave length (deviated states of spin at each lattice point propagate like a wave: magnon )within a ferromagnetic film and between ferromagnetic films, the magnetoresistance change rate is considered to decrease. Here, by dividing into sections a ferromagnetic film disposed adjacent to a granular magnetic film, propagation of the magnon can be prevented. Therefore, even when a sense current is increased, magnetoresistance change rate is suppressed from decreasing, thus, resulting in a large output voltage.

A ferromagnetic film divided into sections by non-magnetic material is also effective even to a conventional ferromagnetic tunnel junction element. Another magnetic element of the present invention, in a ferromagnetic tunnel junction element having a laminate film of ferromagnetic film/insulating layer/ferromagnetic film structure, is formed through division of at least one ferromagnetic film into sections by a non-magnetic material.

A magnetic element of the present invention can be applied to a magnetoresistance effect type magnetic head, a magnetic field sensor, a magnetic memory device and so on. In this case, in particular in a magnetic memory device, it is desirable to provide an in-plane magnetic anisotropy.

DESCRIPTION OF THE PREFERRED EMBODIMENTS

In the following, some embodiments for implementing the present invention will be described with reference to the drawings.

Figure 4:
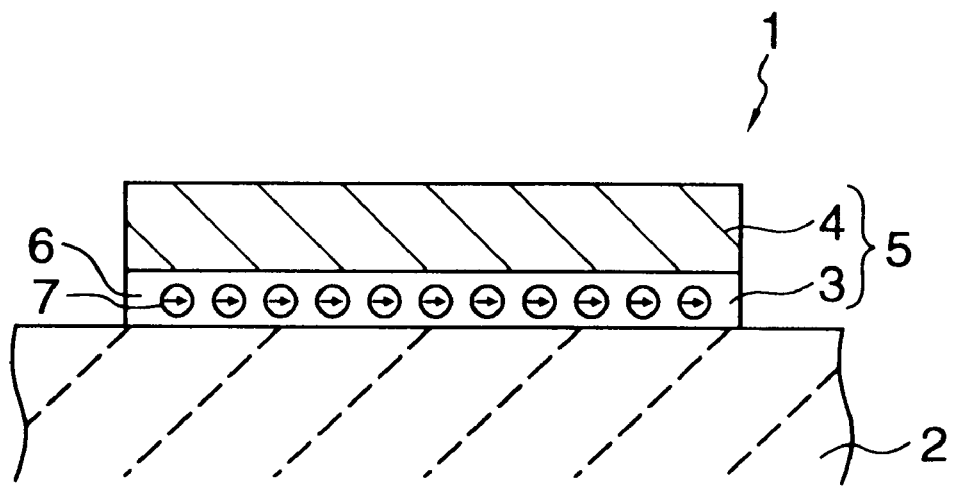
FIG. 4 is a sectional view schematically showing an essential structure of a first embodiment of a laminate type magnetic element employed the present invention.

FIG. 4 is a diagram showing schematically an essential structure of a first embodiment of a magnetic element of the present invention. A magnetic element 1 shown in FIG. 4 comprises a granular magnetic film 3 formed on a substrate 2 and a ferromagnetic film 4 stacked on the granular magnetic film 3. A laminate film 5 stacked these of a granular magnetic film 3 and a ferromagnetic film 4 constitutes a ferromagnetic tunnel junction. In a laminate film 5, order of stacking a granular magnetic film 3 and a ferromagnetic film 4 is not restricted to a particular one.

Figure 5:
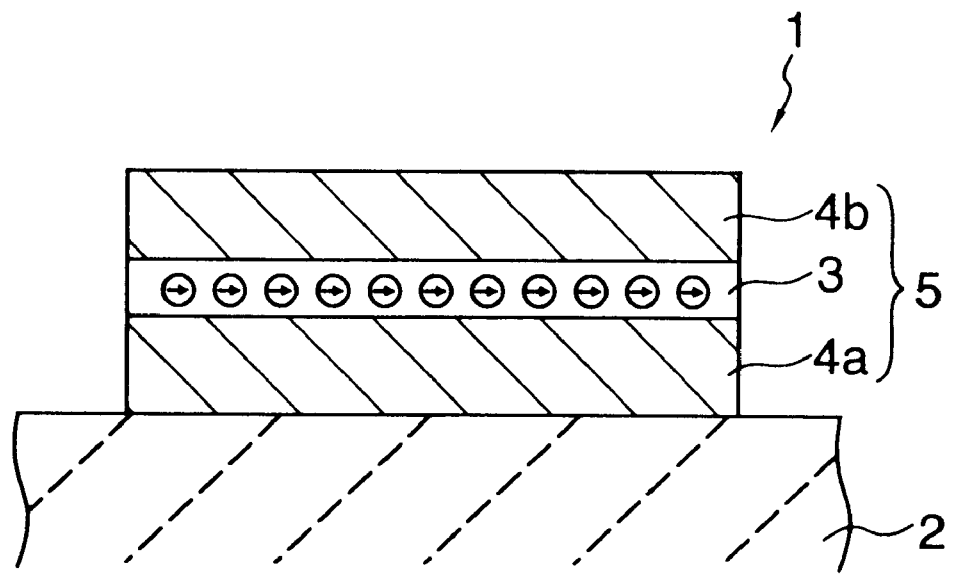
FIG. 5 is a sectional view schematically showing an essential structure of a second embodiment of a laminate type magnetic element employed the present invention.

FIG. 5 is a diagram showing schematically an essential structure of a second embodiment of a magnetic element of the present invention. A magnetic element 1 shown in FIG. 5 has a structure interposing a granular magnetic film 3 between 2 layers of ferromagnetic films 4a, 4b. That is, a first ferromagnetic film 4a and a second ferromagnetic film 4b are disposed in an opposite manner each other while interposing a granular magnetic film 3 therebetween. A laminate film 5 of these 3 layers structure constitutes a ferromagnetic tunnel junction.

Thus, a laminate type magnetic element 1 may have only a laminate film 5 stacked at least one layer of granular magnetic film 3 and at least one layer of ferromagnetic film 4. To a laminate type magnetic element 1, a laminate film further stacked in multiple a granular magnetic film 3 and a ferromagnetic film 4 can be applied. Between a granular magnetic film 3 and a ferromagnetic film 4, an insulation film of a thickness which allows the tunnel current to flow through can be interposed and, with this insulation film, electric resistance can be controlled.

A granular magnetic film 3 has a structure dispersed ferromagnetic fine particles 7 into a dielectric matrix 6. This granular magnetic film 3 does not display superparamagnetism and is a ferromagnetic material having a finite coercive force. The ferromagnetic fine particles 7 in the granular magnetic film 3 are required to be dispersed in the dielectric matrix 6 so as for tunnel current to flow between these fine particles. Thus, distance between particles of the ferromagnetic fine particles 7 is preferable to be 3 nm or less. Further, the particle diameter of the ferromagnetic fine particles 7 is required to be a size of, for example, several nanometers or more which does not show superparamagnetism and can maintain ferromagnetism. However, since, when ferromagnetic particles 7 are too large, distance between particles increases, the particle diameters of the ferromagnetic fine particles are preferable to be in the range of about 5 to 10 nm.

In addition, the ferromagnetic fine particles 7 are preferred to be dispersed in the dielectric matrix 6 in layers. By arraying the ferromagnetic fine particles 7 in layers, the tunnel electric current flowing between the granular magnetic film 3 and the ferromagnetic film 4 can be made homogeneous, resulting in heightening reproducibility of resistance change due to magnetoresistance effect.

For the ferromagnetic fine particles 7, various kinds of ferromagnetic materials can be employed. In a granular ferromagnetic material dispersed ferromagnetic fine particles 7 in a dielectric matrix 6, since coercive force becomes fairly small compared with a bulk material, to prevent this, it is preferable to use Co, Co-Pt alloy, Fe-Pt alloy, transition metal-rare earth alloy or the like particularly large in their magnetic anisotropy as ferromagnetic fine particles 7. When a granular magnetic film 3 is made a magnetically pinned layer, it is particularly preferable to use these ferromagnetic materials.

When a granular magnetic film 3 is used as a soft magnetic layer, the constituent material of the ferromagnetic fine particles is not particularly restricted, but Fe, Co, Ni and alloys including them, oxide based magnetic materials such as magnetite, $CrO_2$, $RXMnO_{3-y}$ (R: rare earth metal, X: at least one kind of element selected from Ca, Ba and Sr, y is a value close to O) and the like large in their spin polarizabilities, Heusler alloys such as NiMnSb, PtMnSb can be used.

Figure 6:
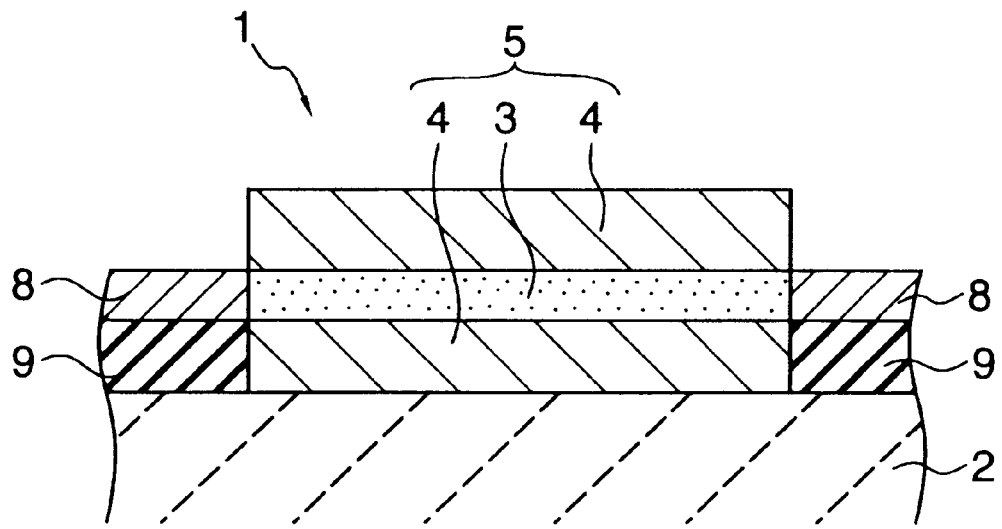
FIG. 6 is a sectional view schematically showing one structural example where a biasing magnetic field is provided to a laminate type magnetic element of the present invention.

When a granular magnetic material not so large in its coercive force is used, as shown in, for example, FIG. 6, on both edge portions of a granular magnetic film 3, a pair of hard magnetic films 8 can be disposed adjacently, and a biasing magnetic field can be provided from this hard magnetic films 8 to a granular magnetic film 3 to pin its spin. In FIG. 6, numeral 9 is an insulating layer.

At least one of films 4,4 in FIG. 6 can be a ferromagnetic film. Thus, when only one side is made a ferromagnetic film, the other one can be made an electrode consisting of a non-magnetic metal such as Cr. For a magnetic biasing film, without restricting to hard magnetic films 8, as shown in, for example, FIG. 7, an antiferromagnetic film 10 stacked with a granular magnetic film 3 can be used. For the antiferromagnetic film 10, an antiferromagnetic alloy such as FeMn, IrMn, PtMn, NiMn and the like and an antiferromagnetic material such as NiO, $Fe_2O_3$ and the like can be employed. In addition, an antiferromagnetic exchange coupling film such as Co/Ru/Co, Co/Au/Co can be used for a magnetic biasing film.

A granular magnetic material dispersed $RXMnO_{3-y}$ particles is low in its coercive force, but has a spin polarizability of 100%. Therefore, when $RXMnO_3Y$ magnetic material is used as ferromagnetic fine particles 7, since spin dependency of tunnel electric current becomes very large, a very large magnetoresistance effect can be obtained. When such a granular magnetic material is used, the above described bias structures are effective. Further, when spin is reversed only in the ferromagnetic film 4, to pin strongly the spin of the granular magnetic film 3, a biasing magnetic film consisting of a hard magnetic film 8 or an antiferromagnetic film 10 is effective.

For a dielectric matrix 6, various dielectric materials such as $Al_2O_3$, $SiO_2$, MgO, $MgF_2$, $B_2O_3$, AlN, $CaF_2$, $SrTiO_3$ and so on can be employed. By dispersing the above described ferromagnetic fine particles 7 in such a dielectric material film, a granular magnetic film 3 not displaying superparamagnetism can be obtained. Further, though, in the above described oxide films, nitride film, fluoride films and the like, defects of respective elements generally exist, such dielectric films do not cause any problem.

Besides, a ferromagnetic film 4, from its objective, may have only a large or small relationship with a granular magnetic film 3. For a ferromagnetic film 4, various kinds of ferromagnetic materials ranging from various kinds of soft magnetic materials such as an Fe-Ni alloy represented by a permalloy, Fe, Co, Ni and alloys containing them all showing ferromagnetism, half-metals of Heusler alloys such as NiMnSb, PtMnSb and the like, oxide based half-metals such as $CrO_2$, magnetite, $(La,Sr)MnO_3$ and the like, amorphous alloys and the like to hard magnetic materials such as a Co-Pt alloy, an Fe-Pt alloy, a transition metal-rare earth alloy, can be used. In a half-metal, since an energy gap exists in one spin band, only electrons having spins of one direction contribute to conduction. Therefore, by employing such a material as a ferromagnetic film 4, a further large magnetoresistance effect can be obtained.

As shown in FIG. 5, when ferromagnetic films 4a, 4b of 2 layers or more are used, they are not necessarily required to be constituted of the same material but may have only difference of coercive force from the granular magnetic film 3. Further, when 2 layers of ferromagnetic films 4a, 4b are different in their coercive forces, it can be used as, for example, a multilevel memory.

Figure 8:
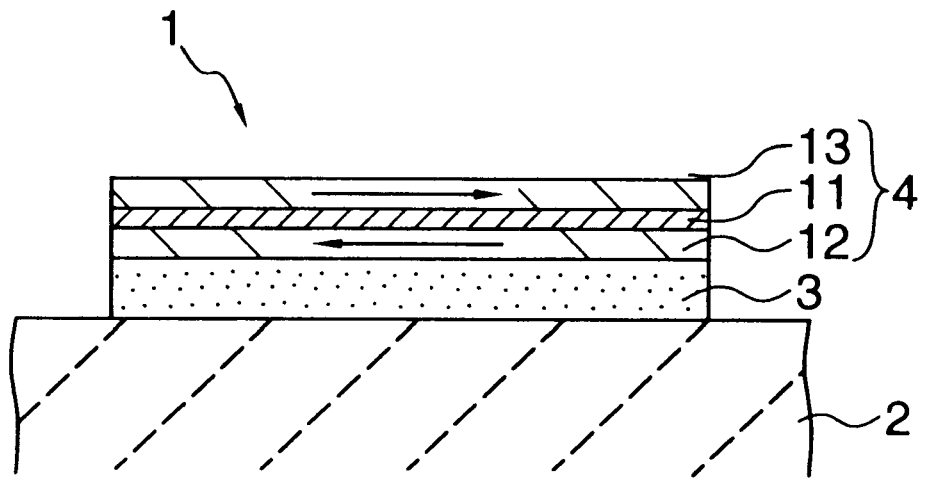
FIG. 8 is a sectional view schematically showing a modification example of a ferromagnetic film in a magnetic element of the present invention.

A ferromagnetic film 4 is not restricted to a single layer film. A ferromagnetic film 4, as shown in, for example, FIG. 8, can be constituted of a laminate film which has 2 layers of ferromagnetic layers 12, 13 disposed through a non-magnetic layer 11 and in which these ferromagnetic layers 12, 13 are coupled so as magnetizations thereof to be aligned anti-parallel each other. Since, according to a laminate film coupled in such an anti-parallel manner, magnetic flux can be prevented from leaking to the outside from a ferromagnetic film 4, this structure can be said to be a preferable one. To obtain ferromagnetic layers 12, 13 coupled in anti-parallel, a ferromagnetic layer and a non-magnetic layer can be stacked alternately to take advantage of exchange coupling or ferromagnetic coupling. Number of stacked ferromagnetic layers is not restricted to 2 layers, but further layers can be stacked through respective non-magnetic layers.

Figure 9:
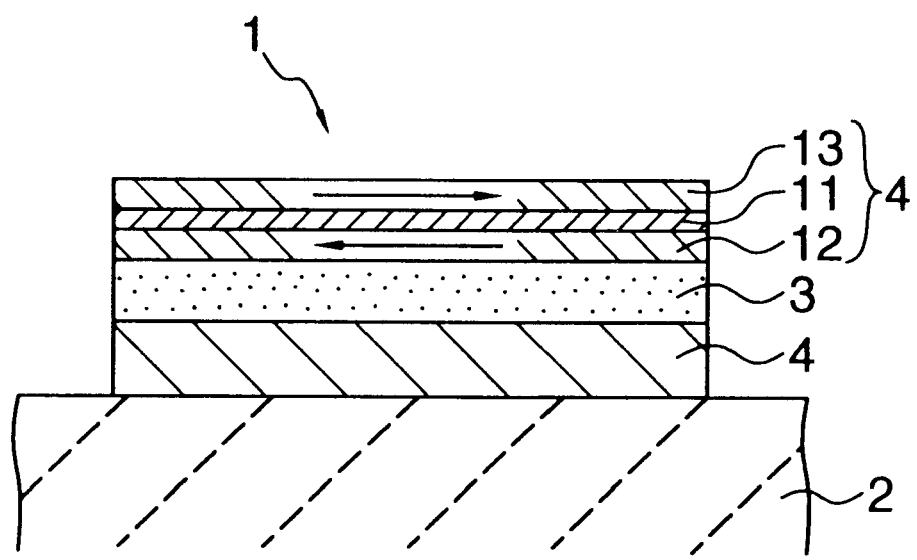
FIG. 9 is a sectional view schematically showing an modification example of the magnetic element shown in FIG. 8.

In addition, a laminate film stacked alternately a ferromagnetic layer and a semiconductor layer can be used as a ferromagnetic film 4. In this case, since their spin can be reversed by heat or light irradiation, a magnetic field is not required. As a semiconductor to be used for such a laminate film, an FeSi alloy of B20 structure can be cited. Here, a laminate film stacked alternately a ferromagnetic layer and a non-magnetic layer or a laminate film stacked alternately a ferromagnetic layer and a semiconductor layer, as shown in FIG. 9, can be applied to one of 2 ferromagnetic layers 4 disposed through a granular magnetic film 3.

The above described granular magnetic film 3 and ferromagnetic film 4 are preferable to have uniaxial magnetic anisotropy within respective film planes. Thereby, together with steep magnetic reversal being possible, its magnetization state can be maintained stable. These are particularly effective when employed in a magnetic memory device. Further, film thicknesses of the granular magnetic film 3 and the ferromagnetic film 4 are preferable to be in the range of from 0.5 to 100 nm. Among them, although the film thickness of the granular magnetic film 3 is desirable to be as thin as possible, but it can be such a film thickness which can maintain uniform thickness during manufacturing and does not adversely affect on tunnel electric current. The film thickness of the granular magnetic film 3 is further preferable to be 50 nm or less.

A magnetic element 1 consisting of such respective layers is typically a thin film, for manufacturing thereof, conventional thin film formation method such as molecular beam epitaxial deposition(MBE)method, various kinds of sputtering methods, vacuum evaporation method and the like can be used. A granular magnetic film 3 can be obtained by simultaneously forming films (simultaneous sputtering, for example)of a dielectric material constituting a dielectric matrix 6 and a ferromagnetic material destined to be ferromagnetic fine particles 7 or by forming films of a dielectric material and a ferromagnetic material alternately. In an alternate filming, since wettability of ferromagnetic material with dielectric material is poor, by controlling accumulation thereof, particles can be formed. According to such a film formation method, ferromagnetic fine particles 7 are uniformly arrayed in layers. In addition, in a magnetic element of the present invention, an under layer consisting of a magnetic material or a non-magnetic material, or an over coat layer consisting of a non-magnetic material can be disposed to a laminate film 5.

In the above described magnetic element 1, through variation, by an external magnetic field, of the direction of spin of the magnetic film of smaller coercive force among a granular magnetic film 3 and a ferromagnetic film 4, a ferromagnetic film 4, for example, magnetoresistance effect is made to appear as described above. That is, in a state where spins of both of a granular magnetic film 3 and a ferromagnetic film 4 are aligned in the same direction, resistance of laminate film 5 becomes minimum. From this state, through reversal, by an external magnetic field and the like, of spin direction of only one magnetic film which is smaller in its coercive force, ferromagnetic film 4, for instance, resistance of the laminate film 5 becomes maximum. In this case, spin of the other magnetic film, granular magnetic film 3, for example, is substantially pinned against an external magnetic field and the like which reverses spin of the ferromagnetic film 4.

By reversing spin of one magnetic film in a laminate film 5 composed of such as a granular magnetic film 3 and a ferromagnetic film 4, a giant magnetoresistance effect of MR change rate of, for example, 20% or more can be obtained. A magnetic film of which spin is reversed by an external magnetic field or the like can be one magnetic film whose coercive force is smaller among a granular magnetic film 3 and a ferromagnetic film 4, and is not particularly restricted to a ferromagnetic film 4. A magnetic film whose spin direction is reversed can be a granular magnetic film 3. However, the spin direction of the ferromagnetic film 4 easy in control of coercive force is preferable to be reversed by an external magnetic field and the like.

By flowing a sense current in a stacked direction to a laminate film 5 displaying a giant magnetoresistance effect, a tunnel current is flowed between a granular magnetic film 3 and a ferromagnetic film 4. When 2 layers of ferromagnetic film are used, a tunnel current is flowed between a first ferromagnetic film 4a, a granular magnetic film 3 and a second ferromagnetic film 4b. By measuring voltage of a sense current including such a tunnel current, an external magnetic field such as a signal magnetic field can be detected.

This function to be able to detect an external magnetic field, as identical as a conventional MR element, can be used for a magnetic head or a magnetic sensor of magnetoresistance effect type. Further, by making the magnetic film, of which coercive force is smaller among a granular magnetic film 3 and a ferromagnetic film 4, a recording layer, and by making the other one a spin pinned layer and judging a magnetization direction of the recording layer by an identical sense current, data recorded in the recording layer can be read. This can be utilized as a magnetic memory device.

In such a magnetic element 1, since a granular magnetic film 3 is not superparamagnetic but is ferromagnetic, a problem that saturation magnetic field is large like a conventional granular GMR material can be cancelled. In addition, since, by selecting a soft magnetic material small in its coercive force for a ferromagnetic film 4, saturation magnetic field is made further small, a magnetic element utilizing magnetoresistance effect can be made further sensitive.

Since, in a granular magnetic film 3, ferromagnetic fine particles 7 are dispersed in a dielectric matrix 6, electric resistance is small compared with a conventional ferromagnetic tunnel junction which has a insulating layer. Further, by controlling the length of current path direction(film thickness direction)of the granular magnetic film 3 or volume packing ratio, size, dispersion state of the ferromagnetic fine particles 7, the electric resistance value can be controlled appropriately. Thereby, when employed in a memory element, for example, quick response of the element or increase of S/N ratio can be attained.

And, the ferromagnetic tunnel junction(laminate film 5) which manifests magnetoresistance effect makes the granular magnetic film 3 function as a tunnel barrier. Since the tunnel current of the laminate film 5 is based on the ferromagnetic fine particles 7 in a granular magnetic film 3 having a finite coercive force, the granular magnetic film 3 is not required to be made thin as much as an insulating layer in a conventional ferromagnetic tunnel junction is. That is, the film thickness of the granular magnetic film 3, being able to make an order where a uniform state can be obtained during manufacturing, a less deviated and stable performance can be obtained with reproducibility.

Figure 10:
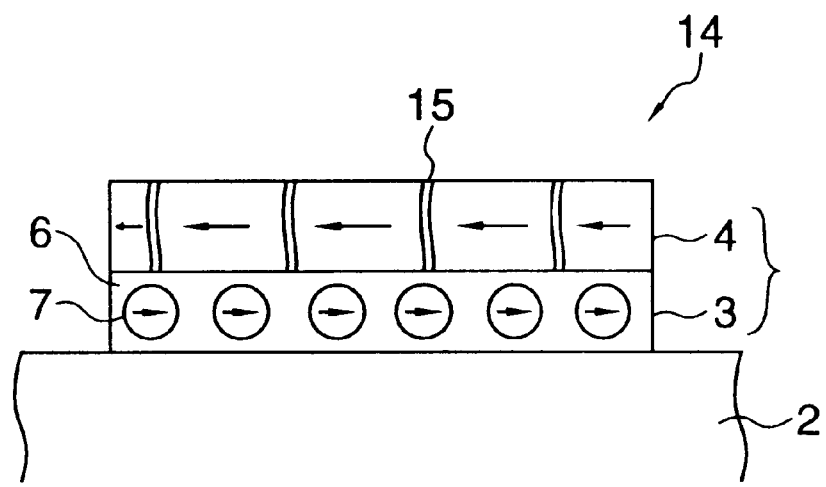
FIG. 10 is a diagram schematically showing an essential structure of a third embodiment of a laminate type magnetic element which employs the present invention.
Figure 11:
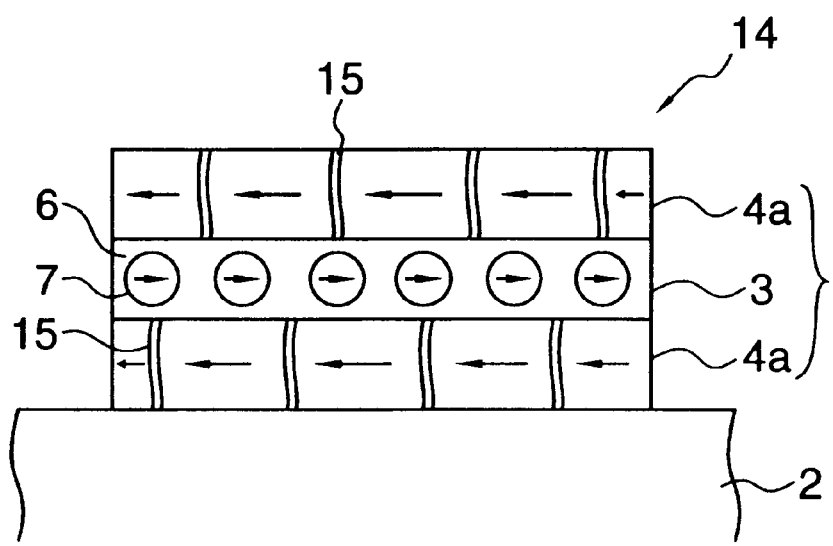
FIG. 11 is a diagram schematically showing an essential structure of a fourth embodiment of a laminate type magnetic element which employs the present invention.

FIG. 10 and FIG. 11 are diagrams schematically showing essential portions of a third and a fourth embodiment of the magnetic elements of the present invention. In magnetic elements 14 shown in these figures, ferromagnetic films 4(4a, 4b)are divided in a film plane direction by non-magnetic material 15. Constitution other than that is identical as magnetic element 1 shown in FIG. 4 and FIG. 5.

As a non-magnetic material 15 dividing the ferromagnetic film 4, single non-magnetic elements such as Ag, Cu, Au, Ta, B, C, Pd, Pt, Zr, Ir, W, Mo, Nb and the like, or various kinds of non-magnetic materials capable of weakening mutual exchange interaction between magnetic materials (magnetic particles) such as a non-magnetic alloy, a non-magnetic compound, a non-magnetic oxide can be used. In addition, the thickness of non-magnetic material 15, similarly, can be, for example, 1 nm or so it it can weaken the exchange interaction between magnetic particles.

Thus, the non-magnetic material is disposed to weaken the mutual exchange interaction between the particles in the ferromagnetic film 4. More specifically, in order to prevent a spin wave (magnon) of a long wave length from propagating within ferromagnetic film 4, the non-magnetic material 15 is disposed within the ferromagnetic film 4. Further, although, in FIG. 11, a structure divided both of the first and the second ferromagnetic films 4a, 4b by non-magnetic material 15 is shown, a structure in which only one ferromagnetic film is divided by non-magnetic material can be adopted.

Here, energy which a magnon of low energy excites is given by the following equation.

$$E=2J(2\pi/N)^2 \qquad (1)$$

Here, N is the number of atoms in a unit volume, J is an exchange energy of magnetic material and is proportional to its Curie point. Therefore, when the energy E of a magnon is given, a magnon can not be excited in a particle smaller in its N than that determined from equation (1).

For instance, when E=0.01 eV, from the equation (1)

$$N^2=(2J/0.01)(2\pi)^2 \qquad (2)$$

is derived. When J=1500K, since 1 eV=$10^4$K, from the equation (2)

$$N=16.8$$

is derived. The size of a grain is derived by setting a lattice constant a=0.25 nm as $$Na=16.8 \times 0.25 \text{ nm}=4.2 \text{ nm}$$

That is, in a particle of which particle diameter is 4.2 nm or less, a magnon possessing an energy of E=0.01 eV or less is not excited.

As described above, through division of ferromagnetic film 4 by non-magnetic material 15 into the size smaller than a certain particle derived from an energy of a magnon, the magnon can be prevented from propagating through the ferromagnetic film 4. However, when the size of the particle after division by the non-magnetic material 15 is too small, spin can not be maintained. Therefore, the ferromagnetic film 4, so as to be able to prevent effectively from propagating magnon, is preferable to be divided, within a range capable of maintaining spin, as small as possible.

As a method to divide a ferromagnetic film by a non-magnetic material, in other words, a method to dispose non-magnetic material into a ferromagnetic film 4, non-magnetic material layer (non-magnetic metal layer, for example) is disposed as a under layer of, for instance, ferromagnetic film 4. Now, in FIG. 10 and FIG. 11, the non-magnetic under layers are not shown. By heat treating such a laminate film, the non-magnetic material 15 can be disposed along grain boundaries of the ferromagnetic film 4. That is, the ferromagnetic film 4 is divided by the non-magnetic material 15 according to the size of its grain. In this case, by controlling the grain size constituting the ferromagnetic film 4 in advance, the ferromagnetic film 4 is divided by the non-magnetic material 15 into magnetic particles of a desired size.

In a magnetic element 14 of this embodiment, since the ferromagnetic film 4 is divided by the non-magnetic material 15, magnon is prevented from propagating. Therefore, even if electric current value flowing to the magnetic element 14, being a ferromagnetic tunnel junction element, is increased to obtain a desired output voltage, magnetoresistance change rate can be suppressed from decreasing. Thereby, a large output voltage can be obtained in an excellent manner. In addition, by dividing the ferromagnetic film 4 by the non-magnetic material 15, the ferromagnetic film 4 becomes more soft magnetic. Therefore, a magnetic element 14 as an MR element can be made more high sensitive.

Figure 12:
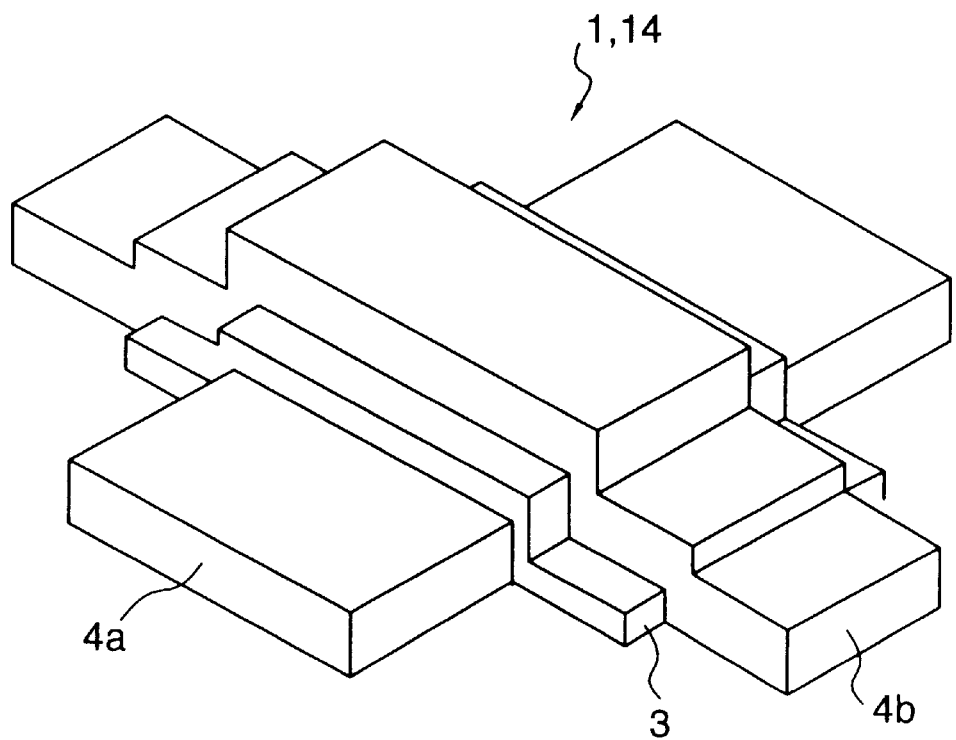
FIG. 12 is a perspective view showing one example of a specific element structure of a laminate type magnetic element of the present invention.
Figure 13:
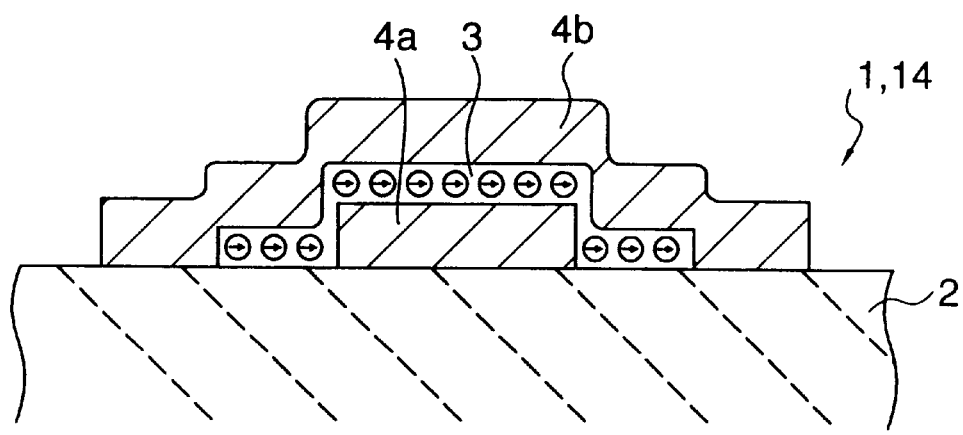
FIG. 13 is a sectional view showing a laminate type magnetic element shown in FIG. 12.

As a specific element structure of the laminate type magnetic elements 1, 14 shown in the above described each embodiment, a structure shown in, for instance, FIG. 12 and FIG. 13 can be cited. That is, on the lower ferromagnetic film 4a formed on a substrate 2, so as to cover in part the lower ferromagnetic film 4a, a granular magnetic film 3 aligned orthogonally therewith and an upper ferromagnetic film 4b are formed in turn. In this case, on the substrate 2, in place of the lower ferromagnetic film 4a, electrode consisting of non-magnetic metal such as Cr can be formed. On the upper ferromagnetic film 4b, as demands arise, an electrode consisting of a conductor such as Cu, Au, Ag or the like can be formed.

In the magnetic elements 1, 14 of such a structure, on a portion(orthogonal portion, for example) where the granular magnetic film 3 and the ferromagnetic film 4 overlap, a ferromagnetic tunnel junction is formed. By flowing a sense current to this portion in a film thickness direction, magnetoresistance effect of the ferromagnetic tunnel junction including the granular magnetic film 3 can be utilized.

Figure 14:
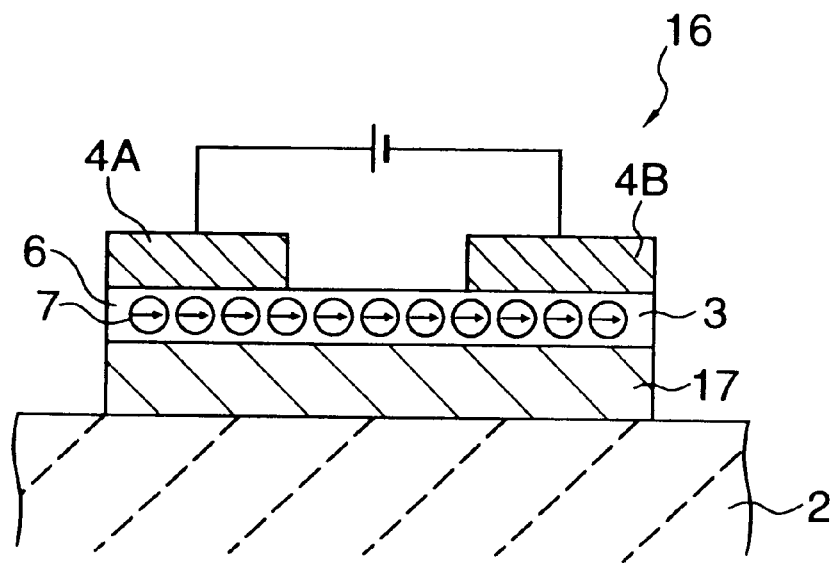
FIG. 14 is a sectional view schematically showing an essential structure of a fifth embodiment of a laminate type magnetic element which employs the present invention.

FIG. 14 is a sectional view showing schematically a structure of an essential portion of a fifth embodiment of a magnetic element of the present invention. In the magnetic element 16 shown in FIG. 14, on the granular magnetic film 3, 2 mutually separated ferromagnetic films 4a, 4b are disposed in parallel. Thus, in a laminate type magnetic element, the laminated region of the granular magnetic film and the ferromagnetic film is not restricted to one. The ferromagnetic films 4a, 4b in this case, as shown in FIG. 15, can be divided in a film plane direction by the non-magnetic material 15.

Figure 1A:
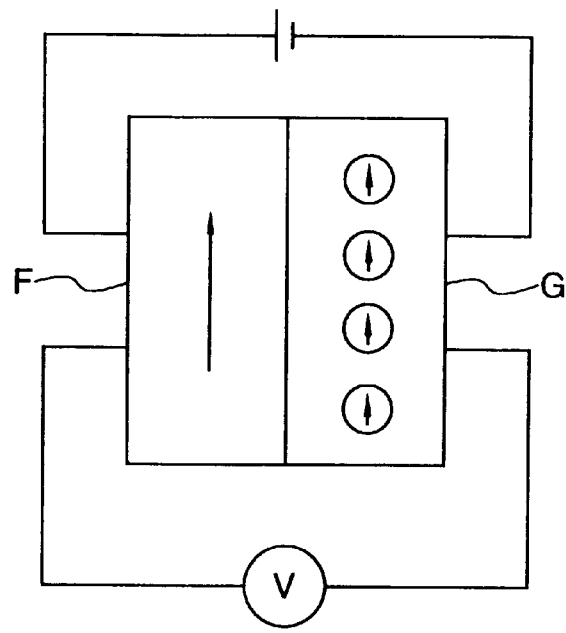
FIG. 1A and FIG. 1B are conceptual diagrams of a primary structure of a magnetic element of the present invention.
Figure 1B:
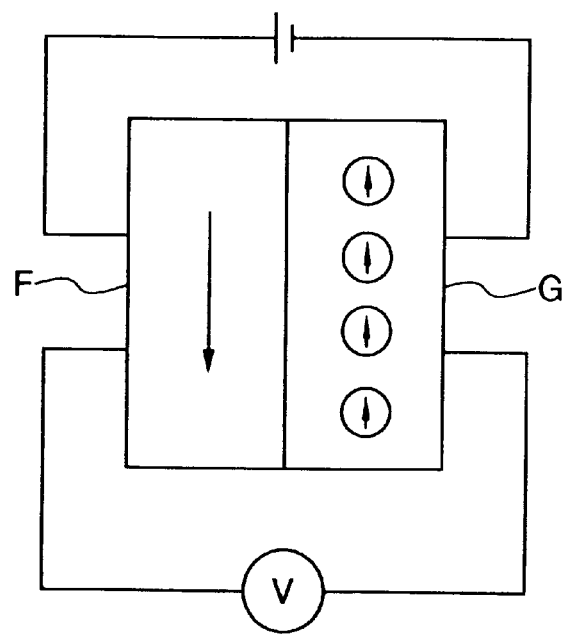
Figure 2A:
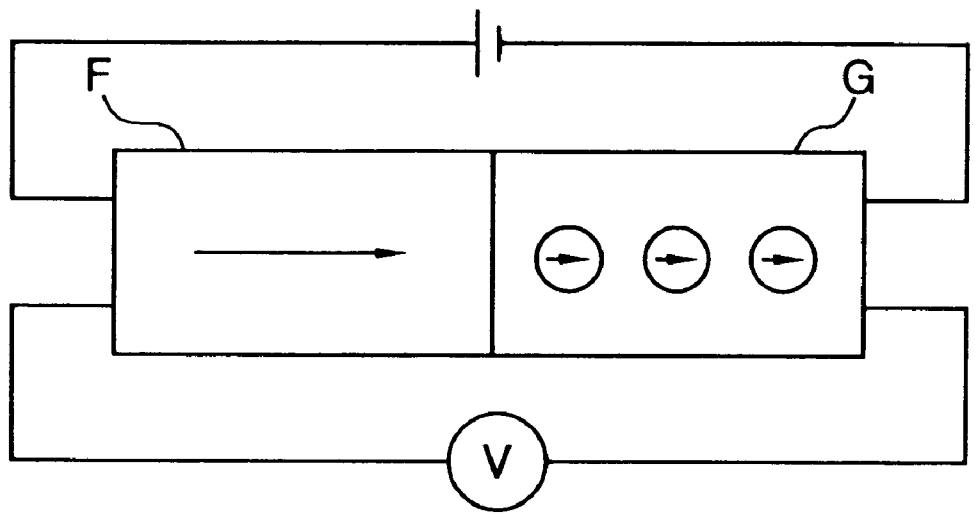
FIG. 2A and FIG. 2B are the other conceptual diagrams of a primary structure of a magnetic element of the present invention.
Figure 2B:
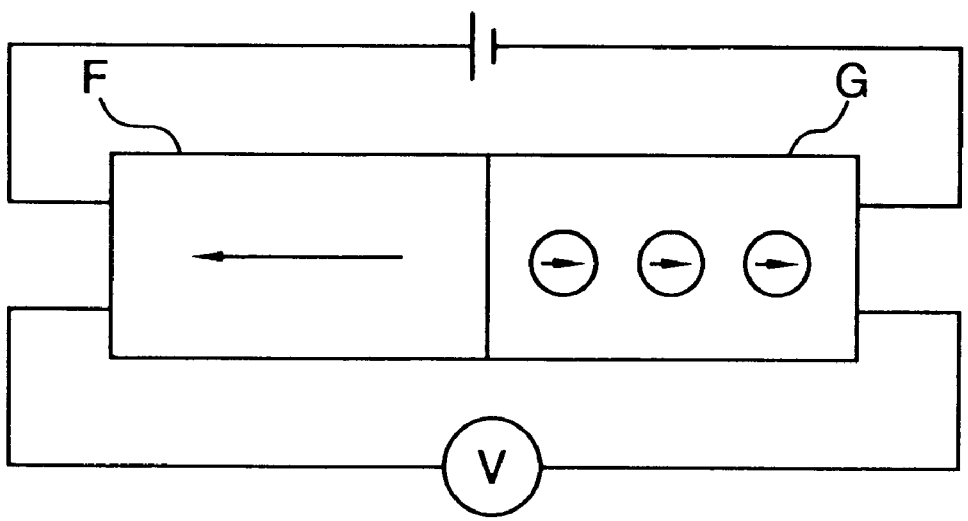
Figure 3A:
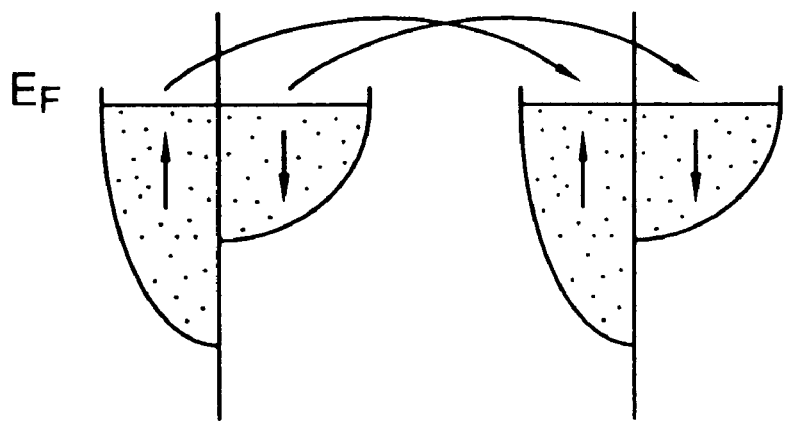
FIG. 3A and FIG. 3B are diagrams explaining manifestation of magnetoresistance effect in a magnetic element of the present invention.
Figure 3B:
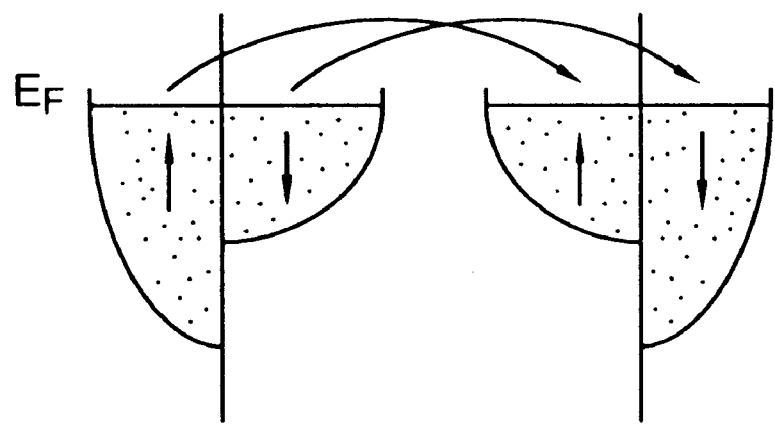
Figure 15:
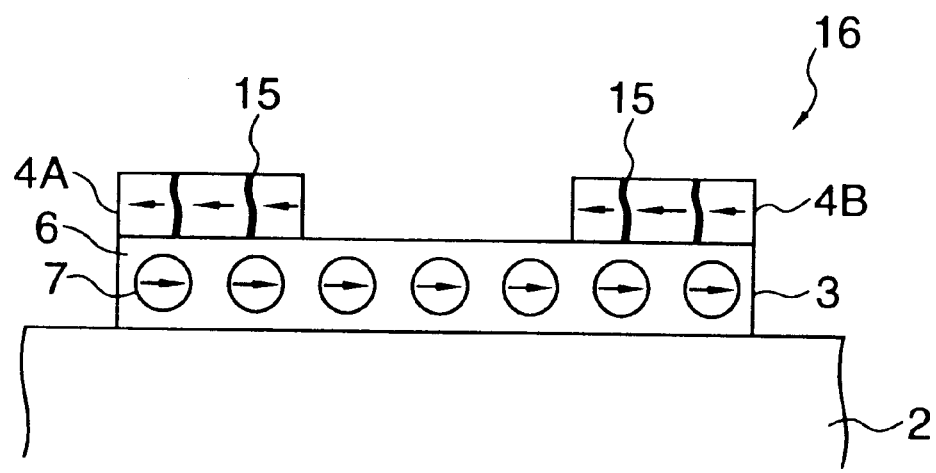
FIG. 15 is a sectional view schematically showing an essential structure of a modification example of a laminate type magnetic element shown in FIG. 14.

In the structures shown in FIG. 14 and FIG. 15, 2 laminated portions of granular magnetic film 3 and ferromagnetic film 4 are formed. In such a structure, below the granular magnetic film 3, an under layer 17 of lower resistance than the granular magnetic film 3 can be preferably disposed. The under layer 17 can be a ferromagnetic metal film or a non-magnetic metal film. By the under layer 17 of low resistance, the tunnel current flowing along film plane of the granular magnetic film 3 can be suppressed.

In a magnetic element 16 of the above described structure, since a plurality of laminated portions composed of granular magnetic film 3 and ferromagnetic film 4 can be utilized, resistance change rate is made possible to be increased. Further, when a magnetic element 16 possesses an under layer 17 of low resistance, electric current of film plane direction flows the under layer 17. Since the resistance of this portion is small and, when the element area being finely divided, can be ignored compared with the resistance traversing the granular magnetic film 3, various kinds of characteristics can be controlled such that the electric resistance can be increased by portion corresponding to the electric current path which traverses the granular magnetic film 3 being 2 times.

Next, another embodiment of a magnetic element of the present invention will be described.

Figure 16:
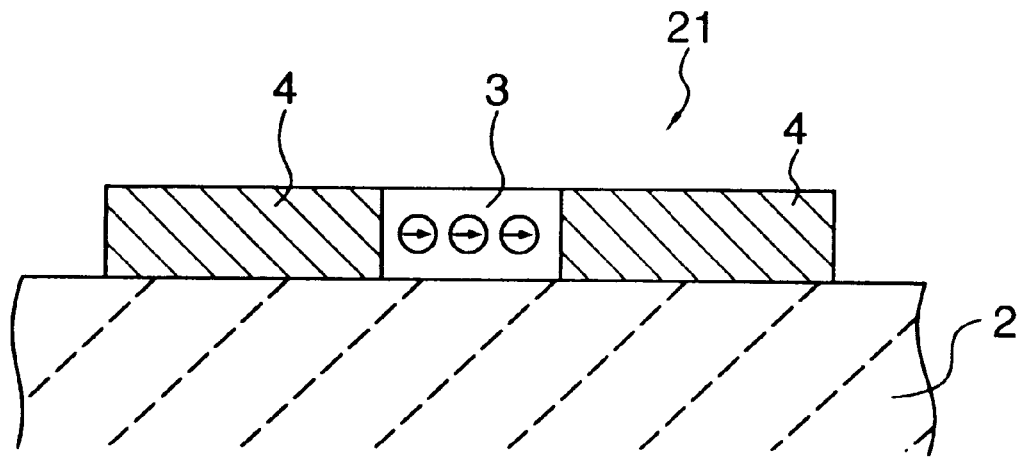
FIG. 16 is a sectional view schematically showing an essential structure of a first embodiment of a planar type magnetic element in which the present invention is applied.

FIG. 16 is a sectional view showing schematically a structure of an essential portion of a first embodiment in which a planar type structure flowing an electric current along substrate surface of the magnetic element of the present invention is employed. In the planar type magnetic element 21 shown in FIG. 16, on a substrate 2, a granular magnetic film 3 and 2 ferromagnetic films 4,4 interposed therebetween a granular magnetic film are arrayed along the substrate surface.

Figure 17:
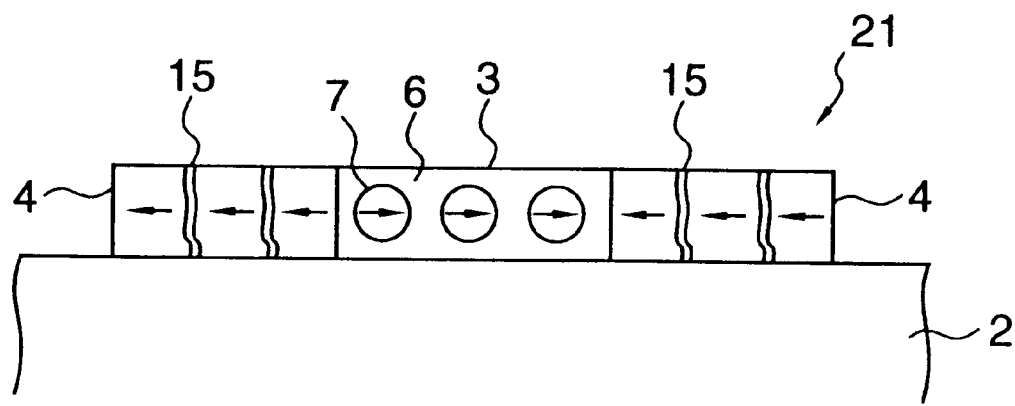
FIG. 17 is a sectional view schematically showing an essential structure of a modification example of a planar type magnetic element shown in FIG. 16.

That is, 2 ferromagnetic films 4,4 (the first and the second ferromagnetic film)disposed in opposite relation with the granular magnetic film 3 interposed are arrayed along a surface of the substrate. The junction portions (parallel arrayed type junction portion)where granular magnetic film 3 and ferromagnetic film 4 are connected in a direction parallel with the substrate surface constitutes ferromagnetic tunnel junctions. The magnetic film 4 in this case, as shown in FIG. 17, can be divided in film plane direction by non-magnetic material 15. In addition, in place of one ferromagnetic film 4, non-magnetic metal film which can be used as electrode can be disposed.

The specific constitution or additional constitution of the respective layers of the planar type magnetic element 21 is identical as those of the above described laminate type magnetic elements 1, 14, magnetic biasing film, for example, can be disposed as demands arise. And, a planar type magnetic element 21, as identical as the above described laminate type magnetic elements 1, 14 other than flowing a sense current including tunnel current between the granular magnetic film 3 and the ferromagnetic film 4 along a substrate surface, by varying, through an external magnetic field and the like, spin direction of the magnetic film (ferromagnetic film 4, for instance)of smaller coercive force among the granular magnetic film 3 and the ferromagnetic film 4, can manifest a giant magnetoresistance effect.

According to such a planar type magnetic element 21, an identical effect as that of the above described laminate type magnetic elements 1, 14 can be obtained. When ferromagnetic film 4 is divided by non-magnetic material 15, since propagation of magnon can be prevented, the decrease of MR change rate can be suppressed even when an electric current is increased. Further, since a planar type can be easily manufactured with a fine processing technology, stable characteristics is liable to be obtained and high densification of the element can be easily attained.

Figure 18:
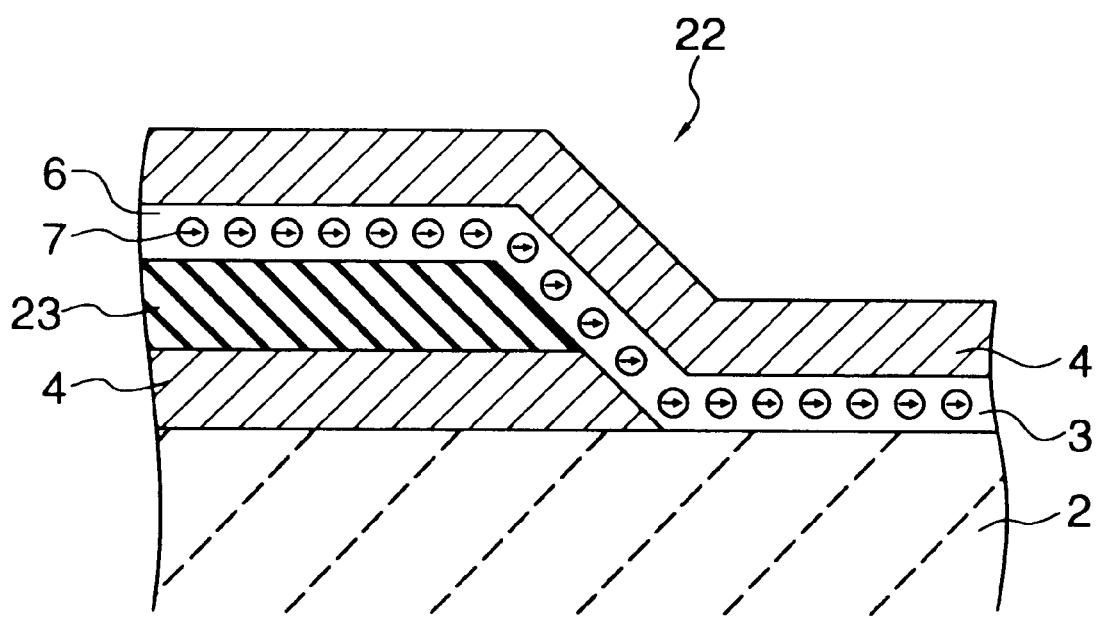
FIG. 18 is a sectional view schematically showing an essential structure of a second embodiment of a planar type magnetic element in which the present invention is applied.

As a planar type element, as shown in, for example, FIG. 18, an edge connecting type structure can be also employed. In an edge connecting type magnetic element 22 shown in FIG. 18, on a substrate 2, a ferromagnetic film 4 and an insulating layer 23 are stacked in turn, the edge surface thereof being a slanted edge surface slanted with a predetermined angle relative to the substrate surface. Granular magnetic film 3 and upper ferromagnetic film 4 are stacked in turn so as to cover at least the slanted edge surface of the laminate film of the lower ferromagnetic film 4 and the insulating layer 23. In the edge connecting type magnetic element 16, a connecting portion of a granular magnetic film 3 and a ferromagnetic film 4 both of which are connected in a parallel direction with the substrate surface at the slanted portion constitutes a ferromagnetic tunnel junction. Here, among 2 layers of upper and lower ferromagnetic films 4, 4, in place of one ferromagnetic film 4, a non-magnetic metal film can be disposed. Even in such an edge connecting type magnetic element 22, an effect identical as that of the planar type magnetic element 21 can be obtained.

Next, one embodiment of another magnetic element of the present invention will be described.

Figure 19:
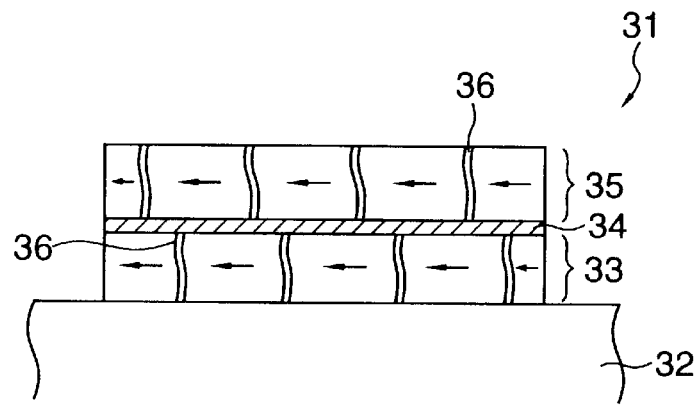
FIG. 19 is a sectional view showing schematically an essential structure of one embodiment of the other magnetic element of the present invention.

FIG. 19 is a sectional view showing schematically a structure of an essential portion of one embodiment of another magnetic element of the present invention. In the magnetic element 31 shown in the figure, on the substrate 32, a first ferromagnetic film 33 is formed. On the first ferromagnetic film 33, a second ferromagnetic film 35 is formed through a tunnel insulating layer 34. The tunnel insulating layer 34 possesses a thickness which allows to flow a tunnel current between the first ferromagnetic film 33 and the second ferromagnetic film 35. The thickness of the tunnel insulating layer 34 is preferable to be 30 nm or less. With these respective elements, a magnetic element (ferromagnetic tunnel junction element) 31 possessing ferromagnetic tunnel junction is constituted.

The first and the second ferromagnetic films 33, 35 are divided in a film plane direction by non-magnetic material 36. The size into which the ferromagnetic films 33, 35 are divided by non-magnetic material 36, material or the thickness of non-magnetic material 36, a method for disposing non-magnetic material 36 into ferromagnetic films 33, 35, and the like are identical as the above described embodiment. In the magnetic element 31 of this embodiment, ferromagnetic films 33, 35 divided by non-magnetic material 36 are suppressed from propagation of magnon.

The first and the second ferromagnetic films 33, 35 are possible to vary spin direction of only one ferromagnetic film due to, for example, external magnetic field, thereby a giant magnetoresistance effect manifests. In the state where the directions of spins of the first and the second ferromagnetic films 33, 35 are in the same directions, the resistance of the ferromagnetic tunnel junction element 31 (resistance of tunnel current in direction perpendicular to the film plane)becomes minimum. From this state, by reversing the direction of the spin of one ferromagnetic film through an external magnetic field and the like, the resistance of the ferromagnetic tunnel junction element 31 becomes maximum. In this case, the spin of the other ferromagnetic film should be substantially pinned against the external magnetic field.

Figure 20:
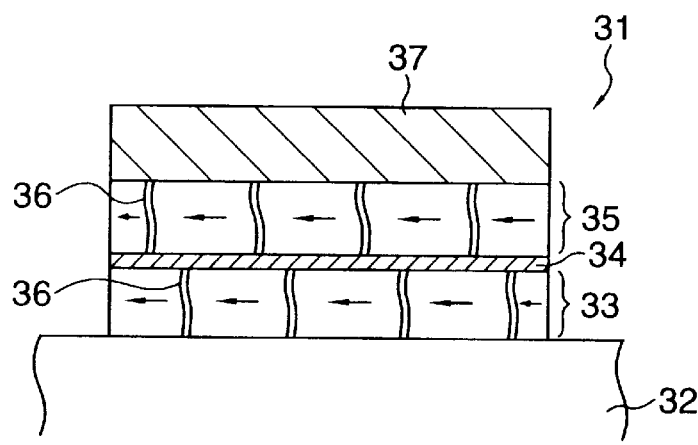
FIG. 20 is a sectional view showing schematically a state in which an antiferromagnetic film is added to a magnetic element shown in FIG. 19.

In order to change spin direction in only one ferromagnetic film among the first and the second ferromagnetic films 33, 35, difference of coercive forces of the ferromagnetic materials, for example, can be utilized. Or, as shown in FIG. 20, one ferromagnetic film (the second ferromagnetic film 35 in FIG. 20) can be stacked with an antiferromagnetic film 37 to pin magnetization through exchange coupling with the antiferromagnetic film 37. For pinning magnetization of one ferromagnetic film, an antiferromagnetic film of Co/Ru/Co, Co/Au/Co and the like can be used.

A specific material for the ferromagnetic films 33, 35 is not restricted to a particular one, but various kinds of ferromagnetic materials ranging from various kinds of soft magnetic materials such as an Fe-Ni alloy represented by a permalloy, Fe, Co, Ni and alloys containing them, a Heusler alloy such as NiMnSb, PtMnSb and the like, an oxide based magnetic material such as $CrO_2$, magnetite, $(La,Sr)MnO_3$ and the like, and an amorphous alloy and the like to hard magnetic materials such as a Co-Pt alloy, an Fe-Pt alloy, a transition metal-rare earth alloy and the like can be employed.

Such a ferromagnetic tunnel junction element 31 is typically a thin film and can be made employing a conventional thin film formation method such as molecular beam epitaxial (MBE) method, various kinds of sputtering methods, evaporation method and the like. In addition, the ferromagnetic tunnel junction element 31 of the present invention can be disposed an under layer consisting of a magnetic material or a non-magnetic material, or an over coat layer consisting of a non-magnetic material.

The ferromagnetic tunnel junction element 31 of the above described embodiment, since the ferromagnetic films 33, 35 are divided by the non-magnetic material 36, can prevent magnon from propagating. Therefore, even if an electric current to be flowed to the ferromagnetic tunnel junction element 31 is increased to obtain a desired output voltage value, decrease of magnetoresistance change rate can be suppressed. Thereby, a large output voltage can be obtained beautifully. Further, through division of the ferromagnetic films 33, 35 by the non-magnetic material 36, the ferromagnetic films 33, 35 are made soft magnetic. Therefore, the ferromagnetic tunnel junction element 31 as an MR element can be made more sensitive.

Figure 21:
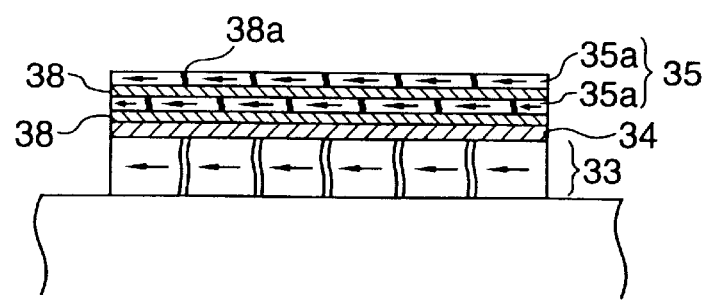
FIG. 21 is a sectional view showing schematically an essential structure of an modification example of a magnetic element shown in FIG. 19.

A structure which divides ferromagnetic films 33, 35 by non-magnetic material 36 is not restricted to the structure shown in FIG. 19. For instance, as shown in FIG. 21, a structure in which a ferromagnetic layer 35*a* and a non-magnetic layer 38 are alternately stacked can be adopted. By forming a ferromagnetic layer 35*a* and a non-magnetic layer 38 alternately under a relatively high gas pressure using sputtering method, a structure in which the ferromagnetic layer 35*a* is divided by the non-magnetic layer 38 can be obtained.

Further, by heat treating ferromagnetic film 35 of a multi-layer structure, a structure disposed non-magnetic material 38*a* along grain boundaries of each ferromagnetic layer 35*a* can be adopted. A ferromagnetic film 35 of such a multi-layer structure is divided by non-magnetic layers 38 disposed in a film thickness direction of each ferromagnetic layer 35*a* and non-magnetic material 38*a* disposed within respective ferromagnetic film 35*a*. In addition, in FIG. 21, although the case where only one ferromagnetic film 35 is made a multi-layer structure is shown, the multi-layer structure can be employed for both ferromagnetic films 33, 35.

For the ferromagnetic film divided by non-magnetic material, a nano crystalline material in which magnetic fine particles of several nanometers are divided by non-magnetic material can be employed. Further, since the granular magnetic film of the above described embodiment has a structure where magnetic fine particles are divided by dielectric matrix, this also can be used as a ferromagnetic film divided by non-magnetic material in the ferromagnetic tunnel junction element 31.

In a ferromagnetic tunnel junction element 31 displaying a giant magnetoresistance effect, by flowing a sense current in its stacked direction, a tunnel current is flowed between a first and a second ferromagnetic films 33, 35. By measuring the voltage of the sense current including such a tunnel current, an external magnetic field such as a signal magnetic field can be detected. Function capable of detecting an external magnetic field, as identical as a conventional MR element, can be used for a magnetic head or a magnetic field sensor of magnetoresistance effect type. In addition, among a first and a second ferromagnetic films 33, 35, one ferromagnetic film smaller in its coercive force is made a recording layer and the other one is made a spin pinned layer, and, by judging magnetization direction of the recording layer with the identical sense current, data written in the recording layer can be read. This can be utilized as a magnetic memory device.

Magnetic elements 1, 14, 16, 21, 22, 31 of the above described respective embodiments can be applied for a magnetoresistance effect type magnetic head, a magnetic field sensor, a magnetic memory device and the like, respectively.

Magnetoresistance effect type magnetic heads employing magnetic heads 1, 14, 16, 21, 22, 31 of the respective embodiments can be constituted in a similar manner as a conventional magnetoresistance effect head can. That is, among a granular magnetic film 3 and a ferromagnetic film 4, or a first ferromagnetic film 33 and a second ferromagnetic film 35, by making use of one magnetic film smaller in its coercive force than that of the other as a free layer, magnetization direction of the free layer is varied according to, for example, a signal magnetic field. By measuring resistances of stacked connecting portion, parallel-arrayed type connecting portion or edge connecting portion at that time, a signal magnetic field can be detected. This is effective as a read head such as a magnetic recording device. In addition, it can be used as a magnetic field sensor.

Then, cases where magnetic elements 1, 14, 16, 21, 22, 31 of respective embodiments are applied for a magnetic memory device such as a magnetic memory and the like will be described.

In this case, of a granular magnetic film 3 and a ferromagnetic film 4, or of a first ferromagnetic film 33 and a second ferromagnetic film 35, one magnetic film smaller in its coercive force than that of the other one is made a recording layer, and the other one is made a pinned layer. For example, when the ferromagnetic film 4 is made a recording layer, reading is executed by measuring a voltage induced between the ferromagnetic film 4 which is a recording layer and the granular magnetic film 3. That is to say, by reversing the spin of the ferromagnetic film 4 which is a recording layer, according to in parallel or in anti-parallel with the spin of the granular magnetic film 3, "1" or "0" is designated.

Since, when the voltage between a ferromagnetic film 4 as a recording layer and a granular magnetic layer 3 is measured, read voltage is different according to "1" or "0" due to magnetoresistance effect, reading can distinguish it. Recording of "1" or "0" into a ferromagnetic film 4 can be executed by disposing a word line above, for example, the ferromagnetic film 4 and flowing a pulse current to it to switch its direction. In this operation, the spin of the granular magnetic film 3 does not change its direction because of its larger coercive force.

The above described magnetic memory device can be constituted in similar manner with any one of magnetic elements 1, 14, 16, 31 of stacked type, magnetic element 21, 22 of planar type. Here, a granular magnetic film 3 can be used for a recording layer, and a ferromagnetic film 4 for a spin pinned layer. Even when a ferromagnetic tunnel junction element 31 is applied, operation principle or the like is identical.

Since the magnetic memory device of the present invention is a non-volatile solid memory and there is no moving portion like an HDD, it is highly reliable and can be operated with more high speed. Furthermore, electric resistance can be controlled in a wide range and recorded information can be read in a non-destructive manner. Further, its output is large.

Next, specific embodiments of the present invention and evaluated results thereof will be described.

EMBODIMENT 1

A ferromagnetic tunnel junction film of the structure as shown in FIG. 12 and FIG. 13 is produced with a high frequency sputtering method. In the ferromagnetic tunnel junction film, a granular magnetic film is a tunnel barrier. At first, on a glass substrate 2, instead of the ferromagnetic film 4a of FIG. 12 and FIG. 13, a strip of Cr film of 10 mm long, 0.5 mm wide is formed to be a lower electrode. Thereon, a granular magnetic film 3 is produced so as to cover a part of the Cr film, and, further thereon, a ferromagnetic film 4b of the same shape with the Cr film is formed so as to run orthogonally with the Cr film. Next, as an upper electrode, Au film is formed, and, by applying voltage between the upper electrode and the lower electrode, the magnetoresistance effect is measured.

A granular magnetic film 3 is produced by sputtering simultaneously $Co_{80}Pt_{20}$ and $SiO_2$ using a $Co_{80}Pt_{20}$ alloy and $SiO_2$ as targets under Ar gas pressure of 0.3 Pa and substrate bias of 400W to form a film (film thickness is 10 nm) dispersed $Co_{80}Pt_{20}$ alloy particles in $SiO_2$. When observed the structure with an electron microscope in this state, about 50% of the $Co_{80}Pt_{20}$ alloy particles are dispersed in $SiO_x$ matrix. By applying bias during filming, the $Co_{80}Pt_{20}$ alloy particles grew to be about 8 nm in particle diameter and about 1.5 nm in their distances between the particles. By measuring magnetization with a sample vibration type magnetometer, coercive force was large as 2 kOe and distinct hysteresis was obtained. In this granular magnetic film, no superparamagnetism was observed.

Figure 22:
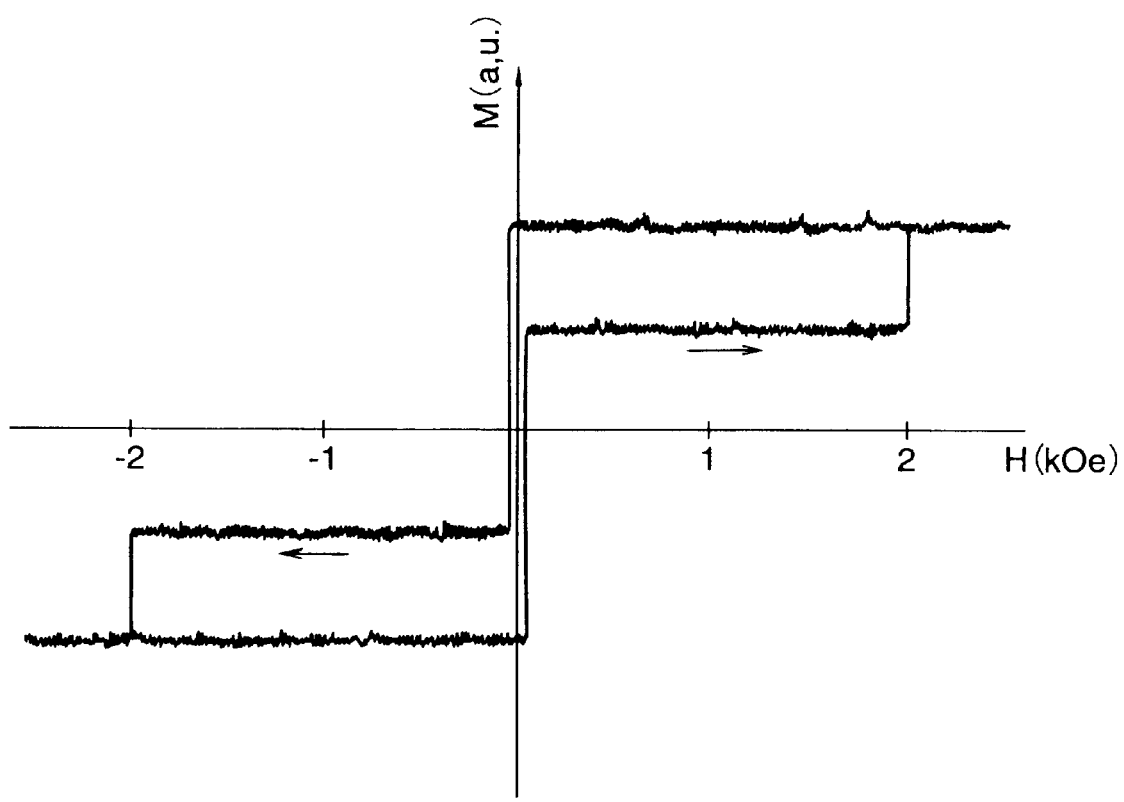
FIG. 22 is a diagram showing measured results of a magnetization curve of a magnetic element according to embodiment 1 of the present invention.

On the above described granular magnetic film 3, as a ferromagnetic film 4b, a $Co_{90}Fe_{10}$ alloy film of a thickness of 20 nm is formed. A magnetization curve of the obtained orthogonally stacked film is shown in FIG. 22. Reflecting a large coercive force of the granular magnetic film 3, in which $Co_{80}Pt_{20}$ alloy particles are dispersed in $SiO_x$ matrix, and a small coercive force of 20 Oe of a ferromagnetic film 4b consisting of $Co_{90}Fe_{10}$ alloy film, distinct 2 step hysteresis is observed.

Figure 23:
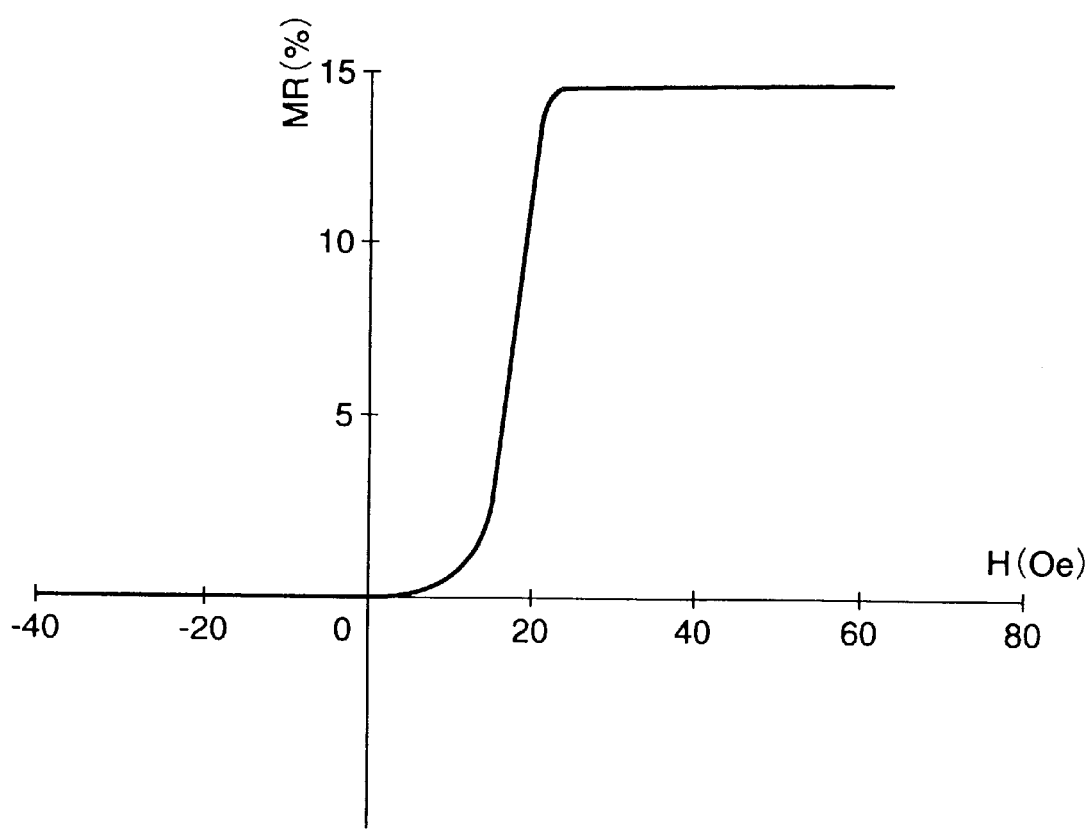
FIG. 23 is a diagram showing measured results of the magnetoresistance effect of a magnetic element according to embodiment 1 of the present invention.

When measuring the magnetoresistance effect, at first, a large magnetic field is provided in minus direction to align spins of $Co_{90}Fe_{10}$ alloy film and the granular magnetic film in minus direction, thereafter, the magnetic field is decreased to reverse towards plus direction. Obtained magnetic field dependency of magnetoresistance change rate is shown in FIG. 23. According to the magnetization curve, the resistance increases steeply at a plus magnetic field such small as about 20 Oe, this small magnetic field shows that magnetic reversal of the $Co_{10}Fe_{10}$ alloy film contributes to magnetoresistance effect. When more large plus magnetic field is provided, the spin of the granular magnetic film is also reversed, resulting in decrease of the resistance. The maximum resistance was 2.8 Ω, the resistance change rate was 14%.

Thus, it is obvious that the magnetic element of the present invention is very sensitive and resistance is smaller than that of a conventional ferromagnetic tunnel junction element in which an insulation film is a barrier.

COMPARATIVE EXAMPLE 1

Figure 24:
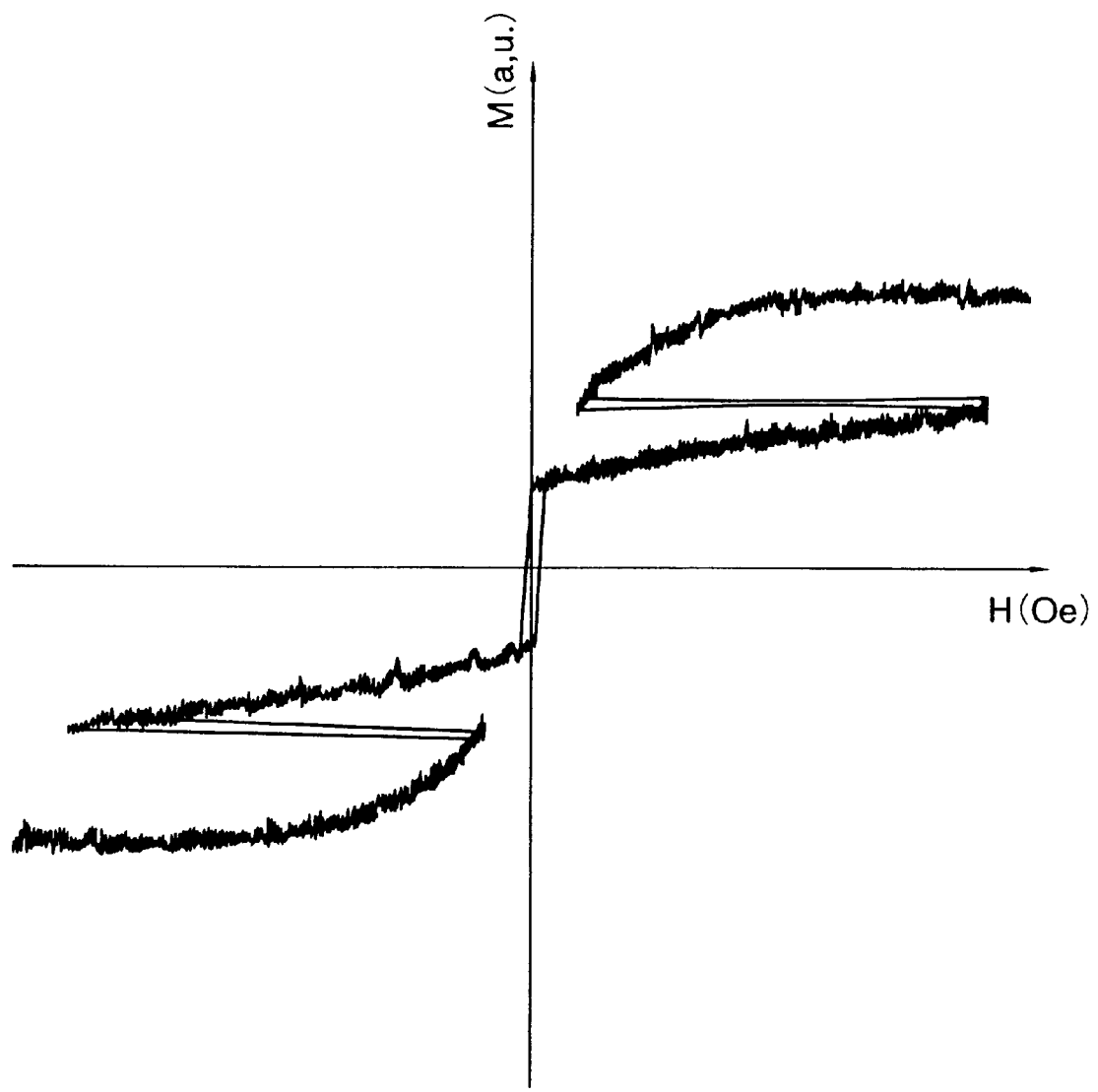
FIG. 24 is a diagram showing measured results of a magnetization curve of a magnetic element according to comparative example 1.

When producing a granular magnetic film, excepting for not providing substrate bias, with identical materials as those of embodiment 1, a stacked film of the same shape is produced. The magnetization curve in this case, as shown in FIG. 24, showed a shape overlapped the magnetization curve of a $Co_{90}Fe_{10}$ alloy film and that of superparamagnetism. A distinct magnetoresistance effect accompanying magnetic reversal of a $Co_{90}Fe_{10}$ alloy film was about 2%. This is caused because, granular magnetic film being superparamagnetic, an anti-parallel state of spins between it and the $Co_{90}Fe_{10}$ alloy film can not be realized.

EMBODIMENT 2

A ferromagnetic tunnel junction film of an edge connecting type shown in FIG. 18 is produced with a high frequency sputtering method. At first, on a glass substrate 2, under a similar condition with embodiment 1, in place of a lower ferromagnetic film 4 of FIG. 18, a Cr film of 10 mm long, 0.5 mm wide, 20 nm thick is formed. Thereon, an AlN insulating layer 23 is formed. Then, with a converged ion beam, an ion beam is irradiated obliquely on the edge surface of the stacked film composed of Cr film and AlN insulation film 23 to process the edge surface of the stacked film into a slanting manner. Thereafter, so as to cover the slanted edge surface, a granular magnetic film 3 dispersed $Co_{80}Pt_{20}$ alloy particles in $SiO_x$ matrix and of a thickness of 10 nm is formed, further thereon, a $Co_{90}Fe_{10}$ alloy film of 20 nm thickness is formed as a ferromagnetic film 4.

In the above described edge connecting type ferromagnetic tunnel junction film, by flowing a sense current between Cr film and $Co_{90}Fe_{10}$ alloy film, its voltage is measured to evaluate magnetoresistance effect. As a result, magnetoresistance effect accompanying magnetic reversal of $Co_{90}Fe_{10}$ alloy film was observed. The magnetoresistance change rate was 22%, magnetic reversal magnetic field was 20 Oe.

EMBODIMENT 3

Figure 7:
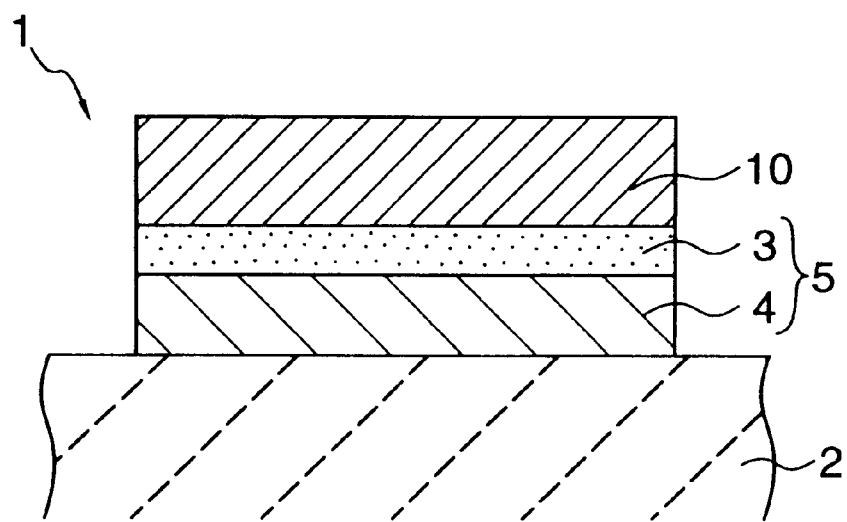
FIG. 7 is a sectional view schematically showing the other structural example where a biasing magnetic field is provided to a laminate type magnetic element of the present invention.

A stacked film of a structure shown in FIG. 7 is produced with a high frequency sputtering method. At first, on a glass substrate 2, as a ferromagnetic film 4, an Fe film of a 20 nm thickness is formed with an Fe target under condition of Ar gas pressure of 0.3 Pa and substrate bias of 400W. Thereon, as a granular magnetic film 3, a film (film thickness of 10 nm) dispersed ferromagnetic $(La_{0.7}Sr_{0.3})MnO_3$ particles in $Bi_2O_3$ was produced by sputtering $(La_{0.7}Sr_{0.3})MnO_3)_{80}$ $(Bi_2O_3)_{20}$ as a target under the above condition. Then, on this granular magnetic film 3, an FeMn antiferromagnetic film 10 of a film thickness of 20 nm was formed.

Next, on the FeMn antiferromagnetic film 10, a Au electrode was sputtered, and a voltage was provided between that and the Fe film to measure magnetoresistance effect. Magnetoresistance change rate was 33%, magnetic reversal magnetic field was 50 Oe. Thus, by employing $(La_{0.7}Sr_{0.3})MnO_3$ particles of 100% spin polarization as granular magnetic material, magnetoresistance change rate is increased and higher sensitivity is obtained.

EMBODIMENT 4

With a sputtering apparatus, at first, on a thermally oxidized Si substrate, a Ag layer of a thickness of 100 nm is formed. After an Fe layer of a thickness of 5 nm is stacked thereon, on this Fe layer, a granular magnetic film is formed. The granular magnetic film is formed by simultaneously sputtering $Co_{80}Pt_{20}$ alloy and $SiO_2$ with $Co_{80}Pt_{20}$ alloy and $SiO_2$ targets under condition of Ar gas pressure of $1\times10^{-3}$ Torr and substrate bias of 300W. As a result, a granular magnetic film dispersed CoPt alloy particles in $SiO_2$ and of a film thickness of 10 nm is obtained. As the result of measurement of magnetic properties, the granular magnetic film was such large as 1.8 kOe in its coercive force, a distinct hysteresis curve was obtained and superparamagnetic behavior was not observed.

On the above described granular magnetic film, after sample 1 stacked Ag(3 nm)/$Ni_{80}Fe_{20}$(5 nm) and sample 2 stacked 10 layers of (Ag(1 nm)/$Ni_{80}Fe_{20}$(2 nm))are produced, a Ag layer is stacked thereon, respectively. Thereafter, samples 1, 2 are respectively heat treated at 300° C. in a magnetic field to give uniaxial anisotropy. By this heat treatment in a magnetic field, Ag is diffused in grain boundaries of an Fe layer and a $Ni_{80}Fe_{20}$ layer both of which are ferromagnetic films. These ferromagnetic layers are clarified to be divided by Ag as a result of section TEM.

Figure 25:
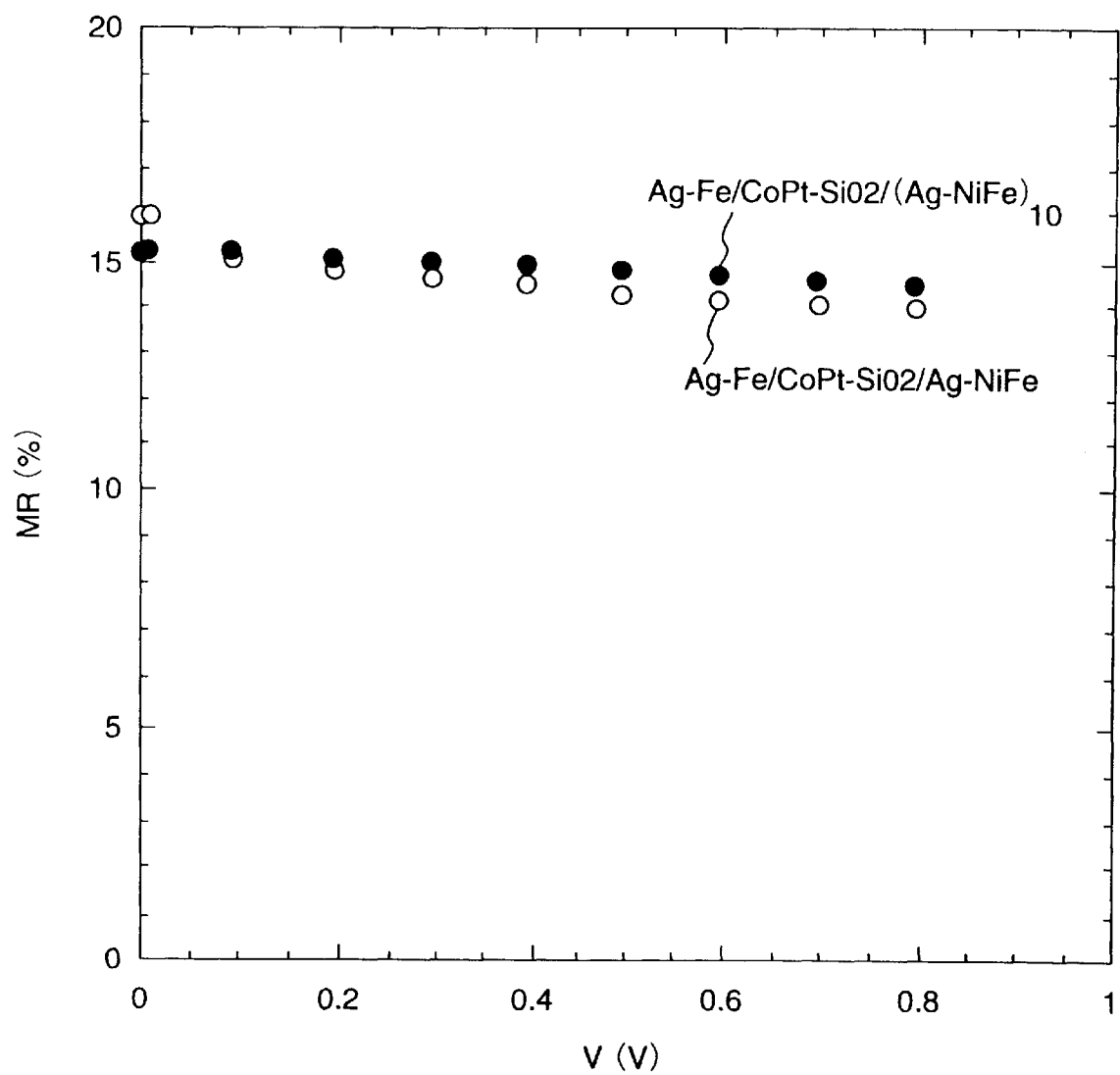
FIG. 25 is a diagram showing measured results of bias voltage dependence of tunnel magnetoresistance change rate of a magnetic element according to embodiment 4 of the present invention.

Bias voltage dependence of tunnel magnetoresistance change rate of samples 1, 2 is measured. Measured results are shown in FIG. 25. As obvious from FIG. 25, even when the voltage inputted to an element is increased, decrease of the magnetoresistance change rate is slight. From this, a magnetic element capable of obtaining a large output voltage can be provided. Further, magnetoresistance of the $Ni_{80}Fe_{20}$ divided by Ag displays a steep change at such a low magnetic field as about 4Oe, and excellent performance as a magnetoresistance type head, a magnetic sensor, a magnetic memory device were shown.

EMBODIMENT 5

With a sputtering apparatus, on a glass substrate, with $Co_{80}Fe_{20}$ and Cu as targets, under the condition of Ar gas pressure of $10^{-3}$Torr, simultaneous sputtering was implemented. Thereafter, annealing was implemented at 300° C for 30 minutes. As a result, a granular magnetic film, dispersed $Co_{80}Fe_{20}$ particles in Cu, of a film thickness of 100 nm was obtained. As a result of measurement of magnetic properties, the coercive force of granular magnetic film was such large as 0.3 kOe, clear hysteresis curve was obtained, and superparamagnetic behavior was not observed.

On the above described granular magnetic film, after an Al film of a thickness of 1 nm was formed, $Ar+O_2$ gas was introduced into chamber to plasma oxidize to form $Al_2O_3$ film. After production of sample 1 stacked thereon Ag(3 nm)/$Ni_{80}Fe_{20}$(5 nm) and sample 2 stacked thereon 10 layers of (Ag(1 nm)/$Ni_{80}Fe_{20}$(2 nm)), a Ag layer of 100 nm thickness was formed as a gap layer thereon, respectively. Thereafter, the sample 1 and the sample 2 were heat treated at 300° C. in a magnetic field to give uniaxial anisotropy. By this heat treatment in a magnetic field, Ag was diffused into $Ni_{80}Fe_{20}$ as a ferromagnetic film. It was obvious from section TEM observation that $Ni_{80}Fe_{20}$ ferromagnetic film was divided by Ag.

Figure 26:
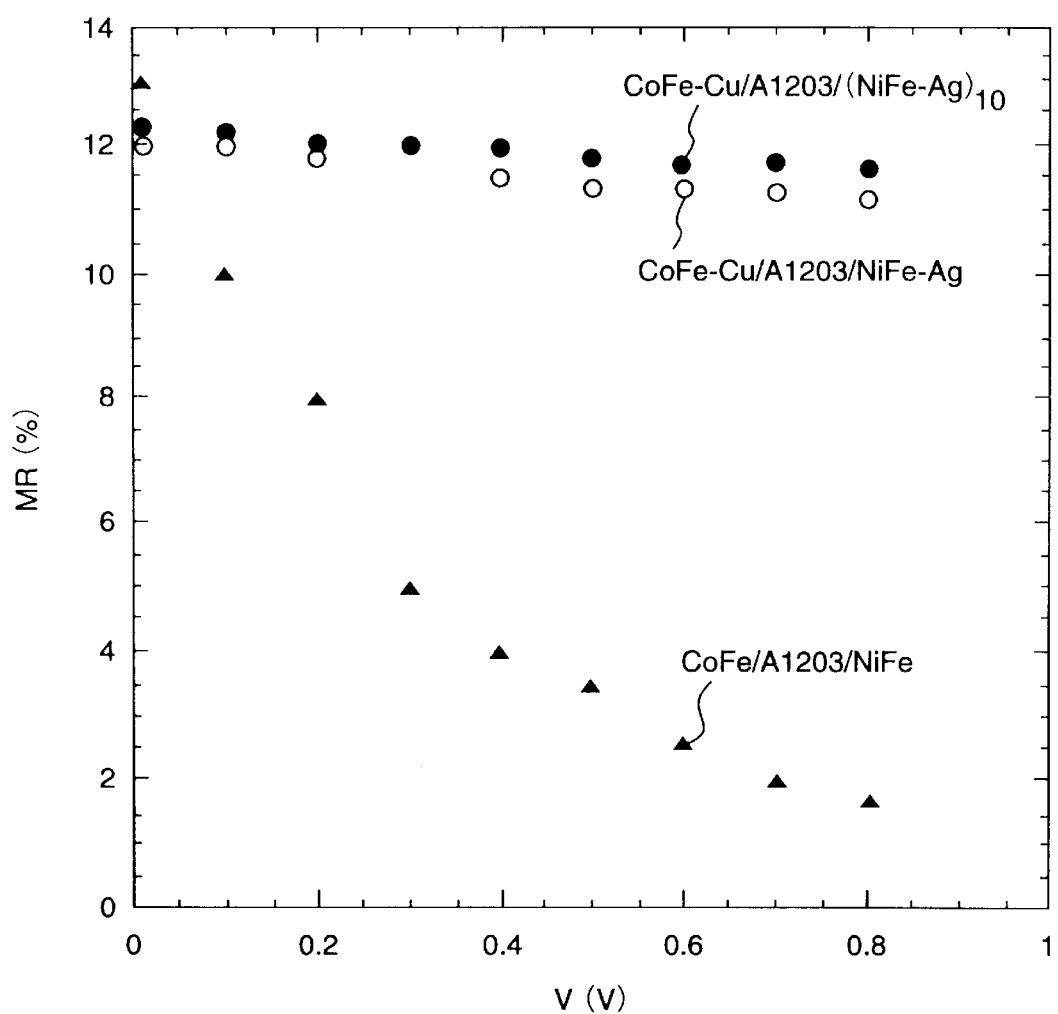
FIG. 26 is a diagram showing measured results of bias voltage dependence of tunnel magnetoresistance change rate of a magnetic element according to embodiment 5 of the present invention.

Bias voltage dependence of tunnel magnetoresistance change rate of these samples 1, 2 was measured. Obtained results are shown in FIG. 26. Here, measured results of a $Co_{80}Fe_{20}/Al_2O_3$/NiFe tunnel junction(comparative example) in which ferromagnetic film is not divided by non-magnetic material are also shown. In a $Co_{80}Fe_{20}/Al_2O_3$/NiFe tunnel junction as a comparative example, magnetoresistance change rate rapidly decreases as voltage inputted to the element is increased, but, in the respective elements of embodiment 2 which have ferromagnetic films divided by non-magnetic element Cu, Ag, even when input voltage value is increased, decrease of magnetoresistance change rate is slight and large output voltage can be obtained. Further, magnetoresistance of the $Ni_{80}Fe_{20}$ divided by Ag displays a steep change at such a low magnetic field as about 4Oe, excellent performance as a magnetoresistance type head, a magnetic sensor, a magnetic memory device were shown.

EMBODIMENT 6

With a sputtering apparatus, on a thermally oxidized Si substrate, a Cr under layer is formed, on this Cr under layer, a granular magnetic film is formed. The granular magnetic film is formed by simultaneously sputtering with $Co_{80}Pt_{20}$ alloy and $Al_2O_3$ as targets under condition of Ar gas pressure of $1\times10^{-3}$ Torr and substrate bias of 300W. As a result, a granular magnetic film dispersed CoPt alloy particles in $Al_2O_3$ and of a film thickness of 10 nm is obtained. As the result of measurement of magnetic properties, the granular magnetic film was such large as 2 kOe in its coercive force, a distinct hysteresis curve was obtained and superparamagnetic behavior was not observed.

On the granular magnetic film, 5 layers of (Mo(1 nm)/$Co_{50}Fe_{30}Ni_{20}$(2 nm)) were formed under the condition of Ar gas pressure of $1\times10^{-2}$ Torr to produce a sample. In this case, if the Ar gas pressure is increased, smooth lamination does not grow, and, as shown in, for example, FIG. 21, a structure of which ferromagnetic film is divided by non-magnetic layers is obtained. By applying fine processing to such a ferromagnetic film with milling, a magnetic element having a structure as shown in FIG. 15 was produced. By heat treating in magnetic field, thereafter, a uniaxial anisotropy was given.

Figure 27:
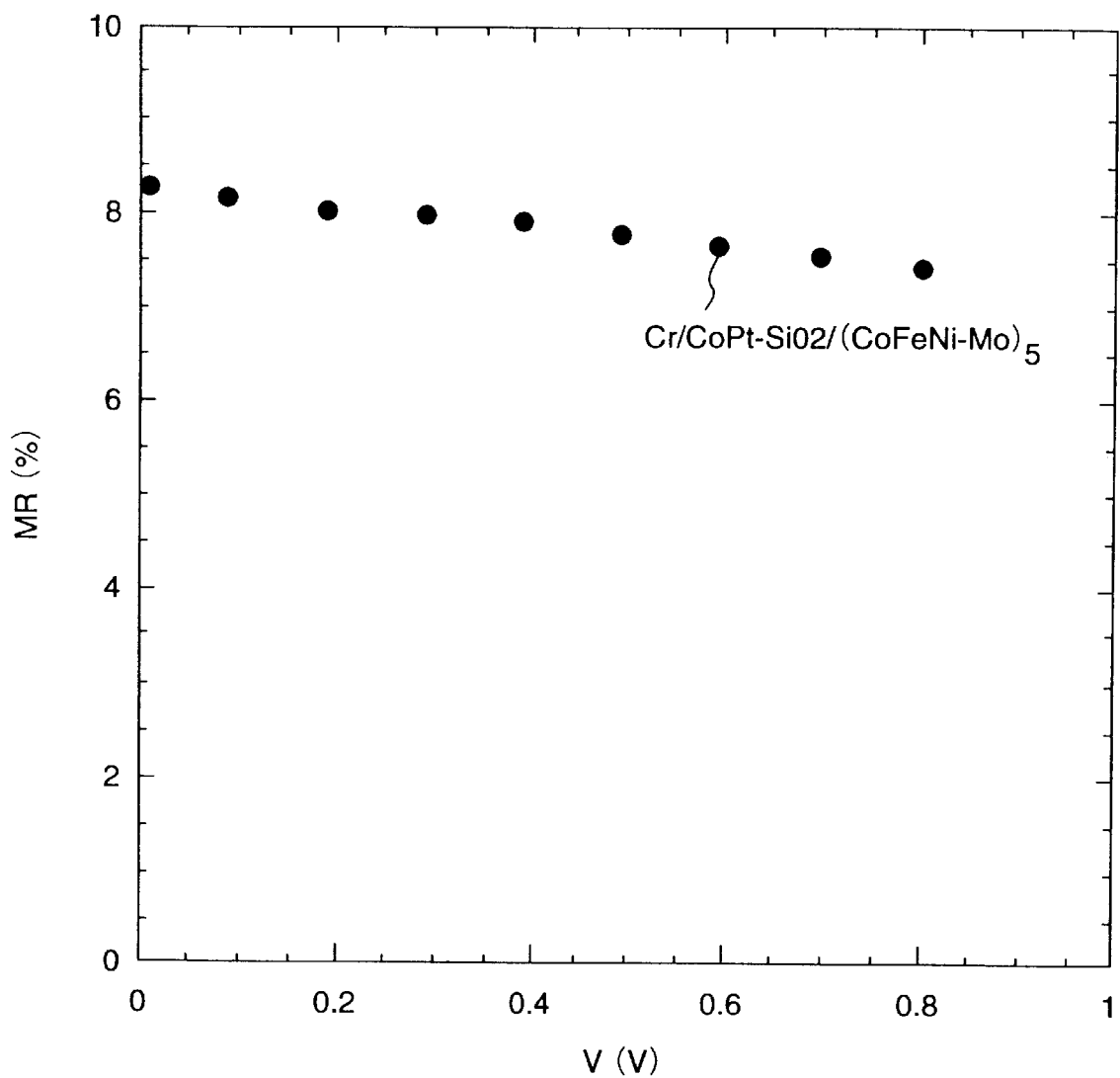
FIG. 27 is a diagram showing measured results of bias voltage dependence of tunnel magnetoresistance change rate of a magnetic element according to embodiment 6 of the present invention.

Bias voltage dependence of tunnel magnetoresistance change rate of the sample is measured. Measured results are shown in FIG. 27. In an element having a ferromagnetic film divided by non-magnetic element Mo, even when input voltage is increased, decrease of the magnetoresistance change rate is slight and a large output voltage can be obtained. Further, magnetoresistance of the $Co_{50}Fe_{30}Ni_{20}$ divided by Mo displays a steep change at such a low magnetic field as about 15Oe, excellent performance as a magnetoresistance type head, a magnetic sensor, a magnetic memory device were shown.

EMBODIMENT 7

With a sputtering apparatus, on a glass substrate, with Co-Fe-Nb-Si-B as a target, sputtering is executed under condition of Ar gas pressure of $1\times10^{-3}$ Torr. Thereafter, annealing is executed at 500° C. for 30 minutes to form a nano-crystal layer of a film thickness of 100 nm. After forming an Al film of a thickness of 1 nm thereon, $Ar+O_2$ gas was introduced into a chamber to plasma oxidize to form an $Al_2O_3$ film.

On the $Al_2O_3$ film, Ag(3 nm)/Co(5 nm) is stacked to form a sample. Further thereon, to pin the magnetization of the Ag(3 nm)/Co(5 nm) layer, after an FeMn film of a thickness of 7 nm is formed, as a gap layer, a Ag layer of a thickness of 100 nm is formed. Thereafter, the sample is heat treated in magnetic field to give a uniaxial anisotropy, and, just above the blocking temperature of FeMn, the direction of the magnetic field is rotated by 90 degrees, and the temperature id lowered to room temperature. By this heat treatment in a magnetic field, Ag is diffused into Co as a ferromagnetic film. Section TEM observation made obvious that, with these, a structure in which one ferromagnetic film is a nano-crystal layer and the other ferromagnetic layer is divided by Ag is obtained.

Figure 28:
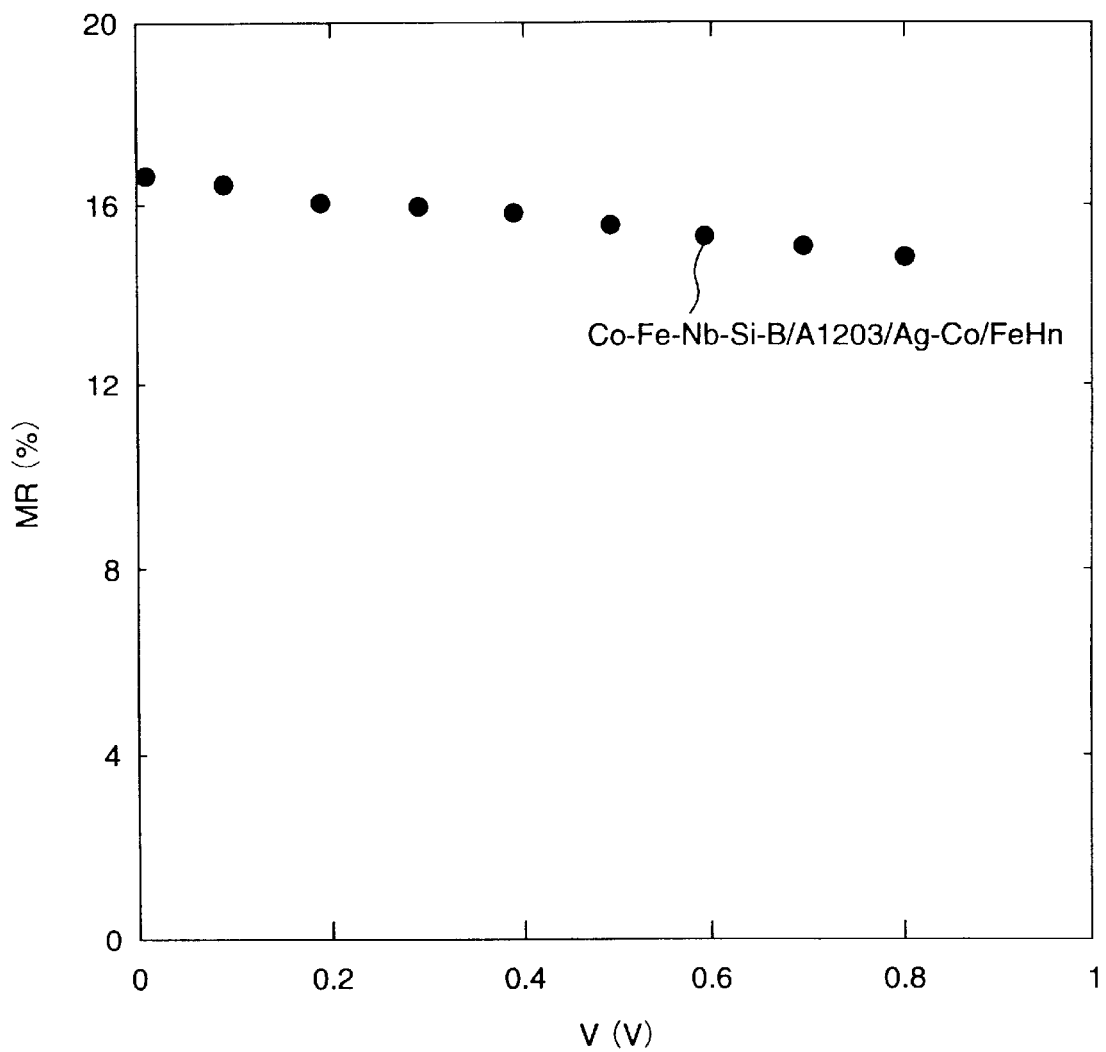
FIG. 28 is a diagram showing measured results of bias voltage dependence of tunnel magnetoresistance change rate of a magnetic element according to embodiment 7 of the present invention.

Bias voltage dependence of tunnel magnetoresistance change rate of the sample is measured. Measured results are shown in FIG. 28. As obvious from FIG. 28, the element of this embodiment, even when input voltage is increased, is slight in its decrease of the magnetoresistance change rate and is large in its output voltage. The magnetoresistance of the nano-crystal layer displayed a steep variation at such a small magnetic field as about 30e, excellent performance as a magnetoresistance type head, a magnetic sensor, a magnetic memory device was shown.

EMBODIMENT 8

With a sputtering apparatus, on a $SiO_2$ substrate, Cr film is formed in a thickness of 100 nm, thereon, a granular magnetic film is formed. The granular magnetic film is formed with $Co_{90}Fe_{10}$ alloy and $Al_2O_3$ as targets by simultaneously sputtering under condition of Ar gas pressure of $1\times10^{-3}$ Torr and substrate bias of 300W. As a result, a granular magnetic film dispersed CoFe alloy particles in $Al_2O_3$ and of a film thickness of 15 nm is obtained. As the result of measurement of magnetic properties, though the granular magnetic film was such small in its coercive force as about 30 Oe, a ferromagnetic hysteresis curve having a distinct squareness is obtained and superparamagnetic behavior was not observed.

On the granular magnetic film, Ag(3 nm)/$Co_{80}Pt_{20}$(5 nm) was stacked and Ag layer of 100 nm thickness was formed as a gap layer to obtain a sample. Thereafter, the sample was heat treated at 300° C. in a magnetic field to give a uniaxial anisotropy. By this heat treatment in a magnetic field, Ag was diffused into grain boundaries of $Co_{80}Pt_{20}$ as a ferromagnetic film. Section TEM observation made obvious that the ferromagnetic film was divided by Ag.

Figure 29:
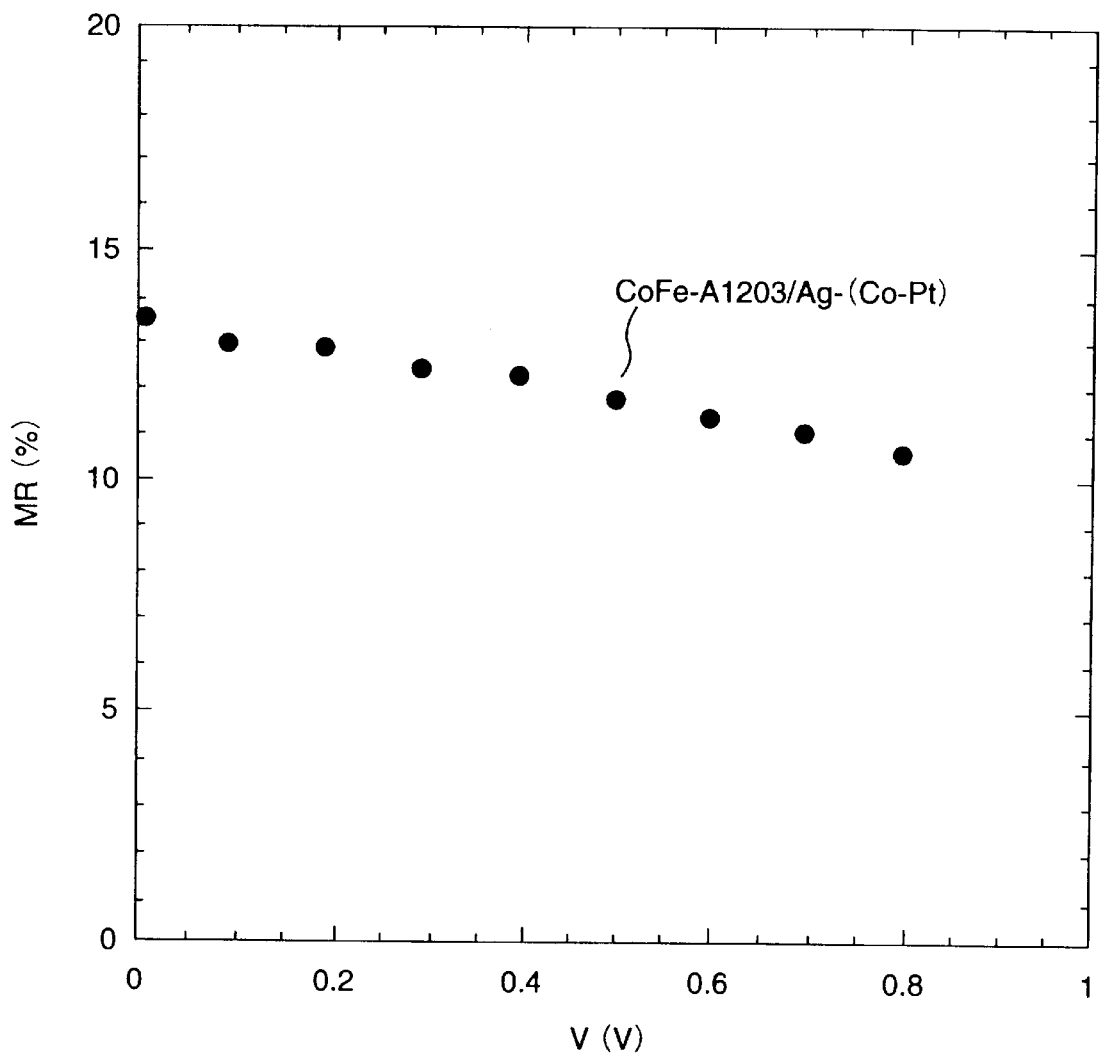
FIG. 29 is a diagram showing measured results of bias voltage dependence of tunnel magnetoresistance change rate of a magnetic element according to embodiment 8 of the present invention.

Bias voltage dependence of tunnel magnetoresistance change rate of the sample was measured. Measured results are shown in FIG. 29. As obvious from FIG. 29, even when the voltage inputted to the element is increased, decrease of the magnetoresistance change rate is slight and a large output voltage can be obtained. Further, the granular magnetic film displayed a steep variation of magnetoresistance at such a low magnetic field as about 30 Oe, excellent performance as a magnetoresistance type head, a magnetic sensor, a magnetic memory device was shown.

What is claimed is:

1. A magnetic element, comprising:
   a granular magnetic film comprising a dielectric matrix and ferromagnetic fine particles which are dispersed in the dielectric matrix, and possessing coercive force at room temperature; and
   a ferromagnetic film which is disposed adjacent to the granular magnetic film and flows a tunnel current between the granular magnetic film.

2. The magnetic element as set forth in claim 1:
   wherein, the ferromagnetic film comprises a first ferromagnetic film and a second ferromagnetic film which are disposed in an opposite relation each other and interposing the granular magnetic film therebetween, wherein, the tunnel current flows between the first ferromagnetic film, the granular magnetic film and the second ferromagnetic film.

3. The magnetic element as set forth in claim 1;
   wherein, magnetoresistance effect is manifested by varying spin direction of one magnetic film among the granular magnetic film and the ferromagnetic film through an external magnetic field.

4. The magnetic element as set forth in claim 1:
   wherein, the granular magnetic film and the ferromagnetic film are stacked so as to form a ferromagnetic tunnel junction.

5. The magnetic element as set forth in claim 1:
   wherein, the granular magnetic film and the ferromagnetic film are stacked on a substrate along one surface of the substrate so as to form a ferromagnetic tunnel junction.

6. The magnetic element as set forth in claim 1:
   wherein, the ferromagnetic fine particles possesses particle diameters in the range of 5 to 10 nm and are dispersed with a distance of 3 nm or less in the dielectric matrix.

7. The magnetic element as set forth in claim 1:
   wherein, the ferromagnetic fine particles are arrayed in layers in the dielectric matrix.

8. The magnetic element as set forth in claim 1:
   wherein, the ferromagnetic film comprises 2 layers of ferromagnetic layer stacked through a non-magnetic layer, wherein, the 2 layers of ferromagnetic layer are coupled in anti-parallel each other.

9. The magnetic element as set forth in claim 1, further comprising:
   a magnetic biasing film inputting biasing magnetic field to the granular magnetic film or the ferromagnetic film.

10. The magnetic element as set forth in claim 9:
    wherein, the magnetic biasing film comprises a hard magnetic film, an antiferromagnetic film or an antiferromagnetic exchange coupled film.

11. The magnetic element as set forth in claim 1:
    wherein, the ferromagnetic film is divided by a non-magnetic material.

12. The magnetic element as set forth in claim 11:
    wherein, the non-magnetic material is disposed along grain boundaries of the ferromagnetic film.

13. The magnetic element as set forth in claim 1:
    wherein, the ferromagnetic film is composed of a ferromagnetic layer and a non-magnetic layer stacked alternately.

14. A magnetic element, comprising:
    an insulating layer possessing a thickness capable of flowing a tunnel electric current;

a first ferromagnetic film and a second ferromagnetic film which are disposed so as to interpose the insulating layer therebetween, at least one ferromagnetic film of the first and the second ferromagnetic films being divided into a plurality of parts; and a non-magnetic material disposed within the ferromagnetic film so as to divide the ferromagnetic film into the plurality of parts.

15. The magnetic element as set forth in claim 14:

wherein, magnetoresistance effect is manifested by varying spin direction of one ferromagnetic film among the first and the second ferromagnetic films through an external magnetic field.

16. The magnetic element as set forth in claim 14:

wherein, the non-magnetic material is disposed along grain boundaries of the ferromagnetic film.

17. The magnetic element as set forth in claim 14:

wherein, the ferromagnetic film has alternately stacked ferromagnetic layer and non-magnetic layer.

18. The magnetic element as set forth in claim 14:

wherein, the ferromagnetic film has ferromagnetic fine particles divided by the non-magnetic material.

19. A magnetic head, comprising:

a magnetic element comprising:

a granular magnetic film possessing coercive force at a room temperature, the granular magnetic film having a dielectric matrix and ferromagnetic fine particles which are dispersed in the dielectric matrix;

a ferromagnetic film which is disposed adjacent to the granular magnetic film and flows a tunnel current between the granular magnetic film; and an electrode providing a sense current so as to flow a tunnel current to the magnetic element.

20. A magnetic memory device, comprising:

a magnetic element comprising:

a granular magnetic film possessing coercive force at a room temperature the granular magnetic film having a dielectric matrix and ferromagnetic fine particles which are dispersed in the dielectric matrix;

a ferromagnetic film which is disposed adjacent to the granular magnetic film and flows a tunnel current between the granular magnetic film;

a recording electrode inputting a current magnetic field to the magnetic element; and a read electrode providing a sense current so as to flow a tunnel current to the magnetic element.

21. The magnetic element as set forth in claim 14:

wherein the non-magnetic material is disposed in direction perpendicular to a film plane of the ferromagnetic film.

* * * * *

UNITED STATES PATENT AND TRADEMARK OFFICE
CERTIFICATE OF CORRECTION

PATENT NO.: 6,114,056

DATED: September 5, 2000

INVENTOR(S): Inomata et al.

It is certified that an error appears in the above-identified patent and that said Letters Patent is hereby corrected as shown below:

Claim 3, column 22, line 19, change "claim 1;" to --claim 1:--.

\* Claim 20, column 24, line 12, change "room temperature" to --room temperature,--.

Signed and Sealed this

Fifteenth Day of May, 2001

Attest:

NICHOLAS P. GODICI

Attesting Officer

Acting Director of the United States Patent and Trademark Office